United States Patent
Kojima et al.

(10) Patent No.: US 10,365,834 B2
(45) Date of Patent: *Jul. 30, 2019

(54) MEMORY SYSTEM CONTROLLING INTERLEAVING WRITE TO MEMORY CHIPS

(71) Applicant: Toshiba Memory Corporation, Minato-ku (JP)

(72) Inventors: Yoshihisa Kojima, Kawasaki (JP); Katsuhiko Ueki, Katsushika (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/421,933

(22) Filed: Feb. 1, 2017

(65) Prior Publication Data

US 2017/0147235 A1 May 25, 2017

Related U.S. Application Data

(63) Continuation of application No. 14/447,810, filed on Jul. 31, 2014, now Pat. No. 9,569,117.

(Continued)

(51) Int. Cl.
| | |
|---|---|
| *G06F 3/06* | (2006.01) |
| *G06F 12/06* | (2006.01) |
| *G06F 13/16* | (2006.01) |
| *G06F 12/02* | (2006.01) |
| *G11C 7/10* | (2006.01) |
| *G11C 16/04* | (2006.01) |

(Continued)

(52) U.S. Cl.
CPC ............ *G06F 3/0613* (2013.01); *G06F 3/064* (2013.01); *G06F 3/0659* (2013.01); *G06F 3/0688* (2013.01); *G06F 12/0246* (2013.01); *G06F 12/0607* (2013.01); *G06F 13/1647* (2013.01); *G11C 7/1042* (2013.01); *G11C 16/0483* (2013.01); *G11C 16/10* (2013.01); *G11C 16/3427* (2013.01); *G06F 2212/1016* (2013.01); *G06F 2212/1032* (2013.01); *G06F 2212/7208* (2013.01)

(58) Field of Classification Search
CPC ... G06F 3/0613; G06F 3/0659; G06F 13/1647
See application file for complete search history.

(56) References Cited

U.S. PATENT DOCUMENTS

| | | |
|---|---|---|
| 8,180,994 B2 | 5/2012 | Sprouse et al. |
| 8,301,850 B2 | 10/2012 | Kawano et al. |

(Continued)

FOREIGN PATENT DOCUMENTS

| | | |
|---|---|---|
| JP | 2011-59889 | 3/2011 |
| JP | 2012-533139 | 12/2012 |

*Primary Examiner* — Ann J Lo
*Assistant Examiner* — Michelle L Taeuber
(74) *Attorney, Agent, or Firm* — Oblon, McClelland, Maier & Neustadt, L.L.P.

(57) ABSTRACT

According to one embodiment, a controller executes a first process such that writing is performed in an order of page numbers in the memory chip. The first process includes a second process to be executed in an order of group units. The second process includes a process of writing data to the lower pages of the memory chips belonging to the banks in one group, and subsequently writing data to the upper pages of the memory chips belonging to the banks in the group.

23 Claims, 29 Drawing Sheets

Related U.S. Application Data

(60) Provisional application No. 61/951,367, filed on Mar. 11, 2014.

(51) Int. Cl.
*G11C 16/10* (2006.01)
*G11C 16/34* (2006.01)

(56) References Cited

U.S. PATENT DOCUMENTS

| | | |
|---|---|---|
| 8,397,018 B2 | 3/2013 | Dhakshinamurthy et al. |
| 2010/0011158 A1* | 1/2010 | Shiraishi ............ G06F 13/1647 |
| | | 711/103 |
| 2010/0169553 A1 | 7/2010 | Yano |
| 2011/0060866 A1 | 3/2011 | Kawano |
| 2013/0301352 A1* | 11/2013 | Shim .................. G11C 16/10 |
| | | 365/185.03 |
| 2014/0013031 A1 | 1/2014 | Masuo |
| 2015/0012684 A1 | 1/2015 | Avila |

\* cited by examiner

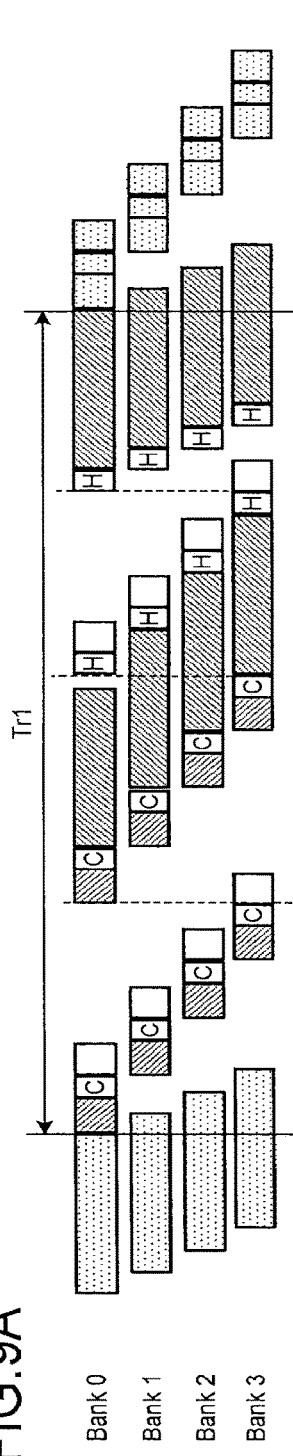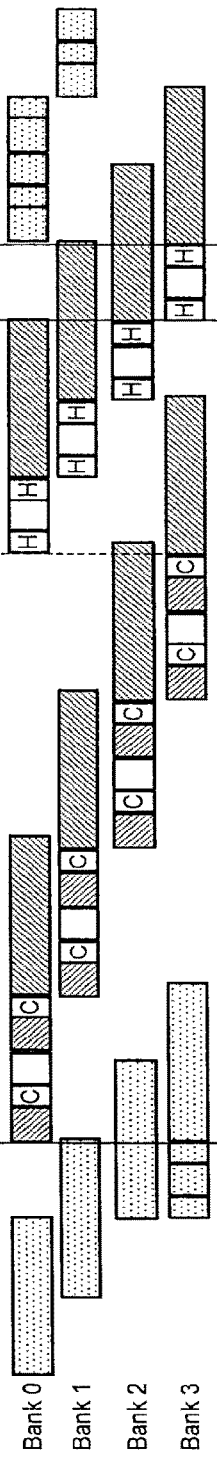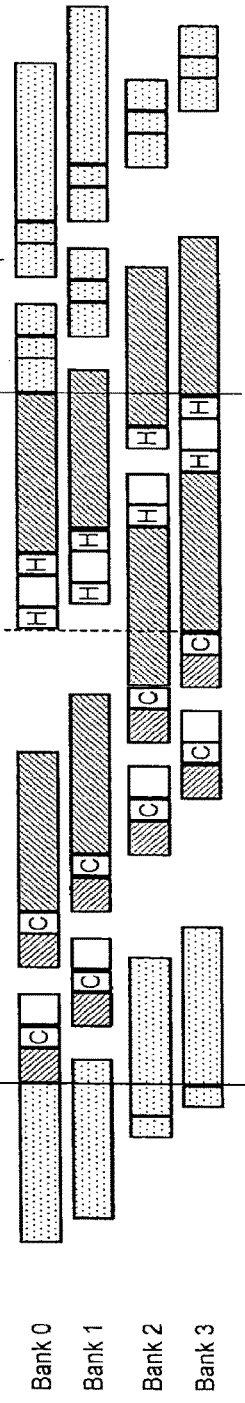

FIG.11A
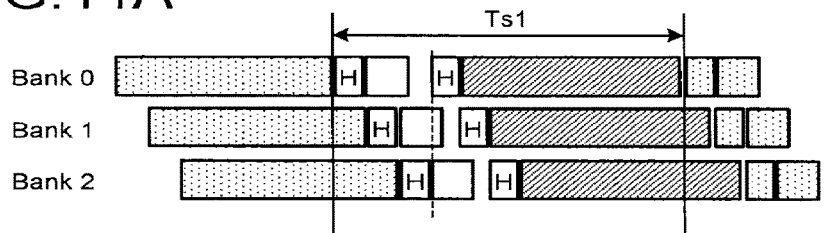
FIG.11B
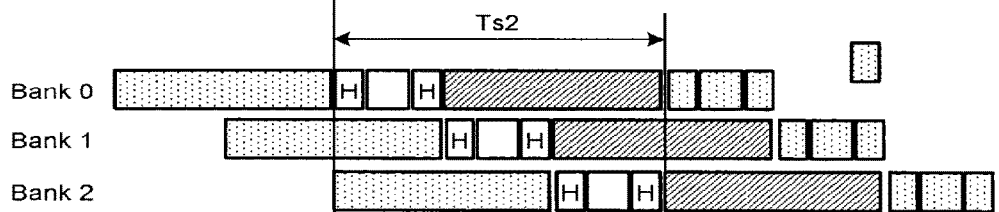
FIG.11C
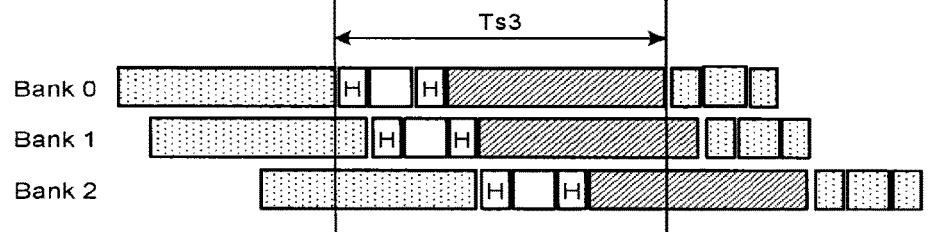
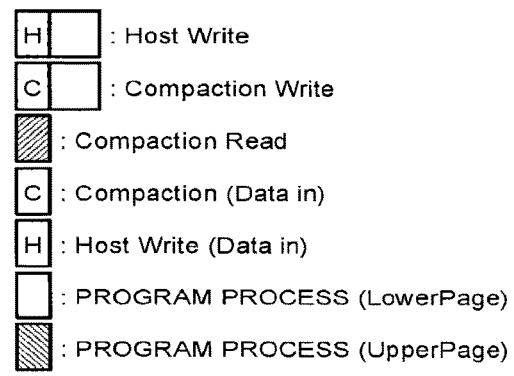

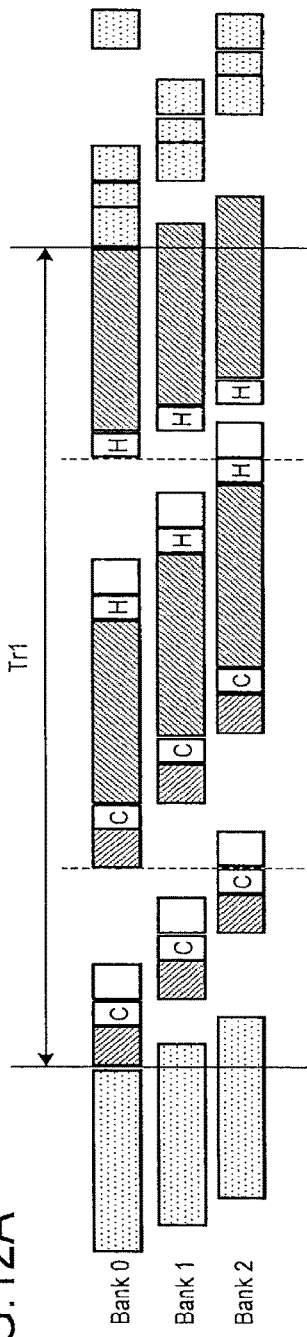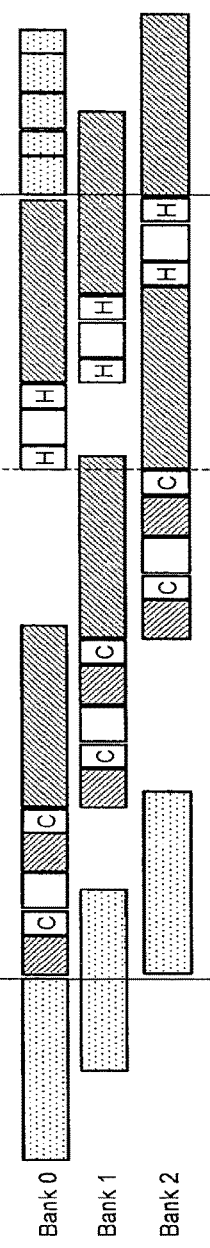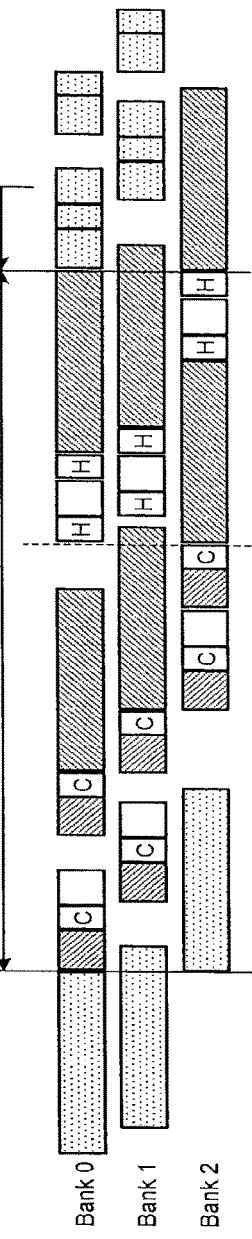

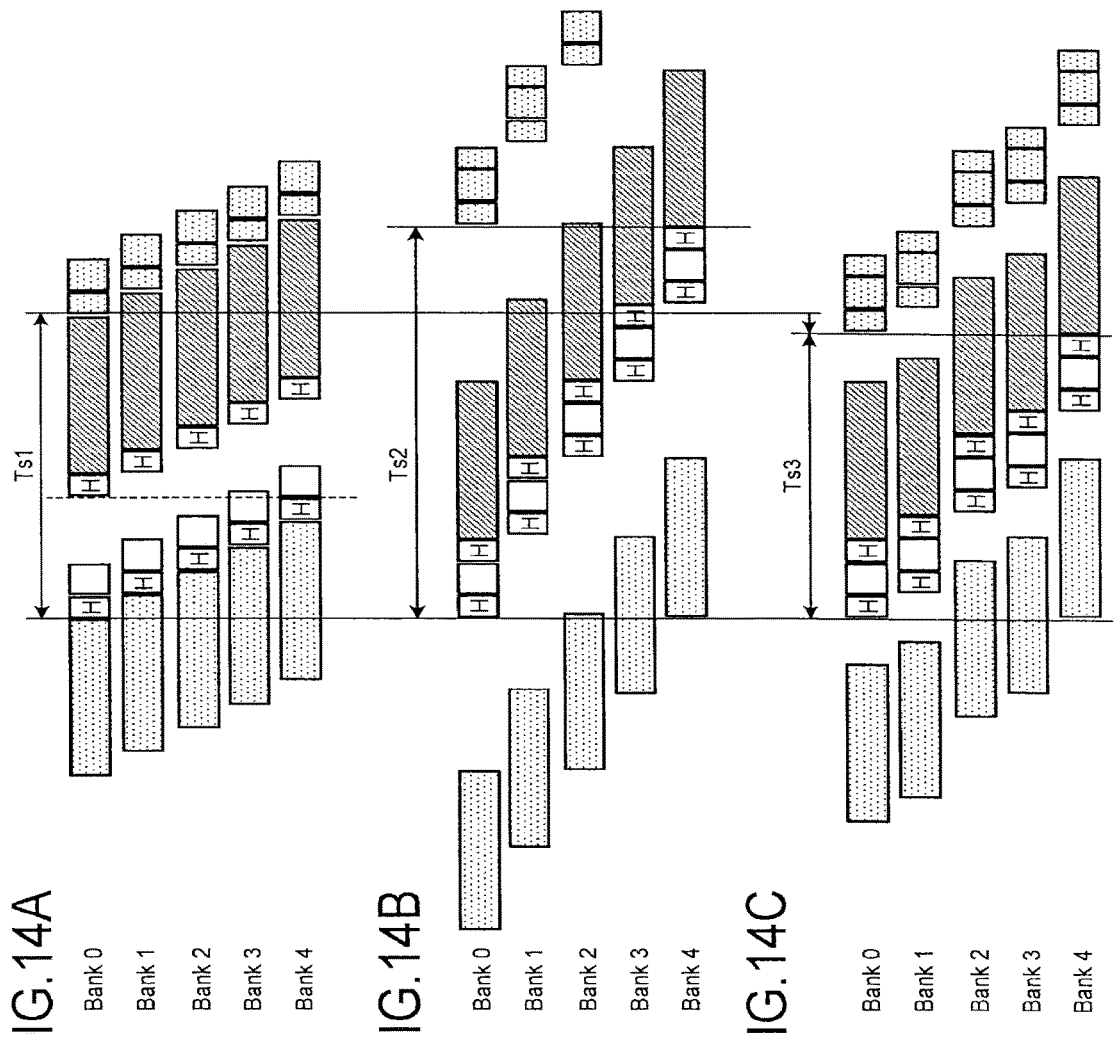

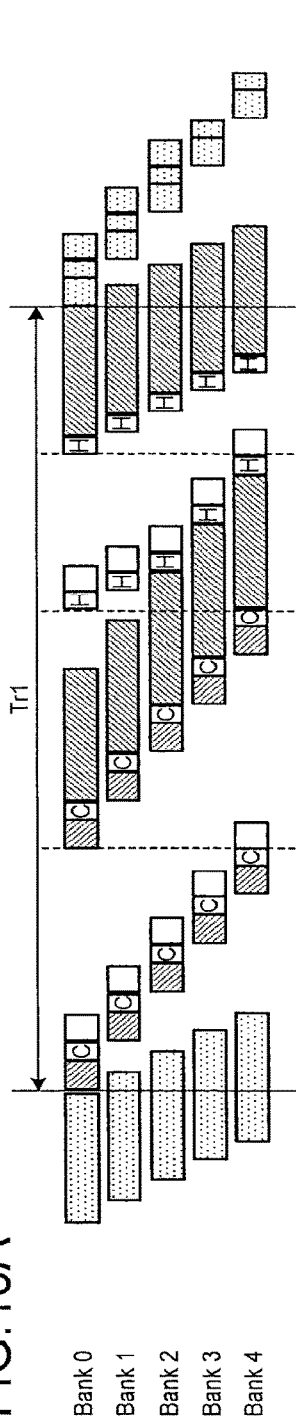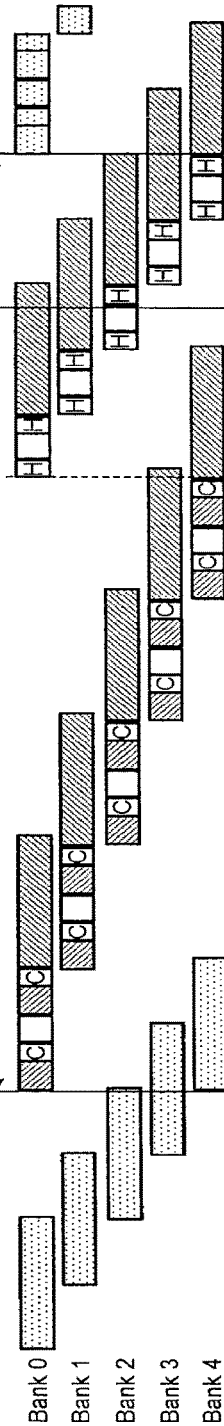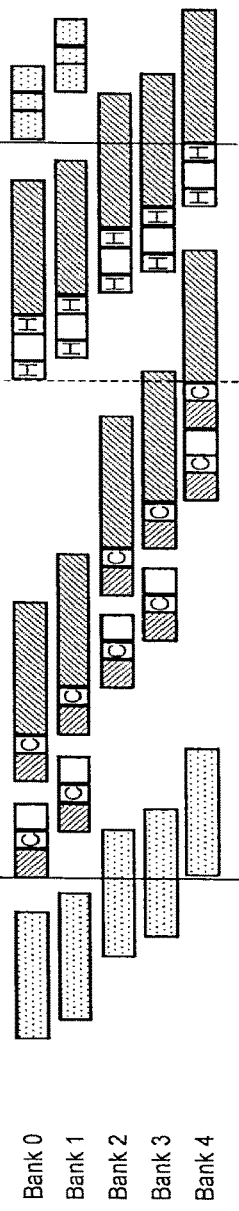
FIG.15A
FIG.15B
FIG.15C

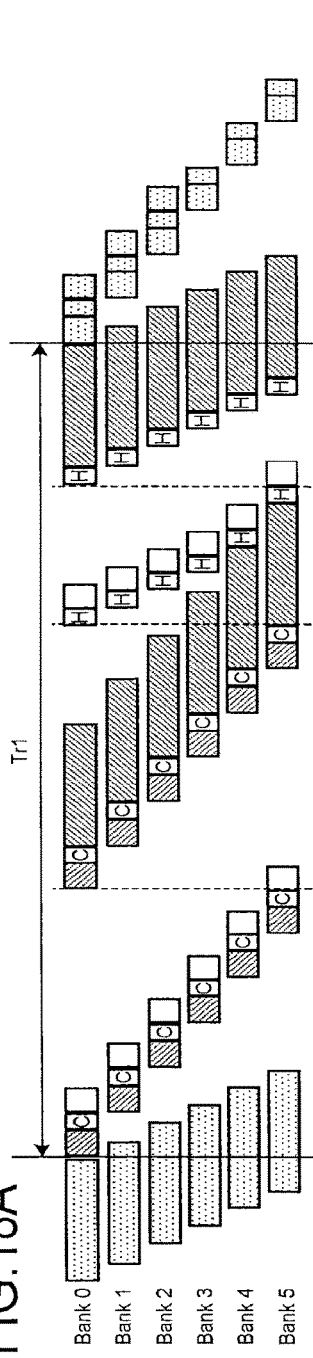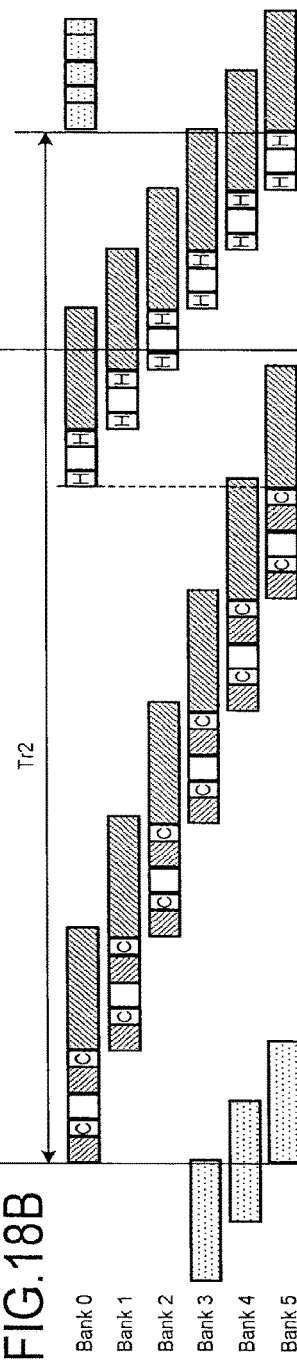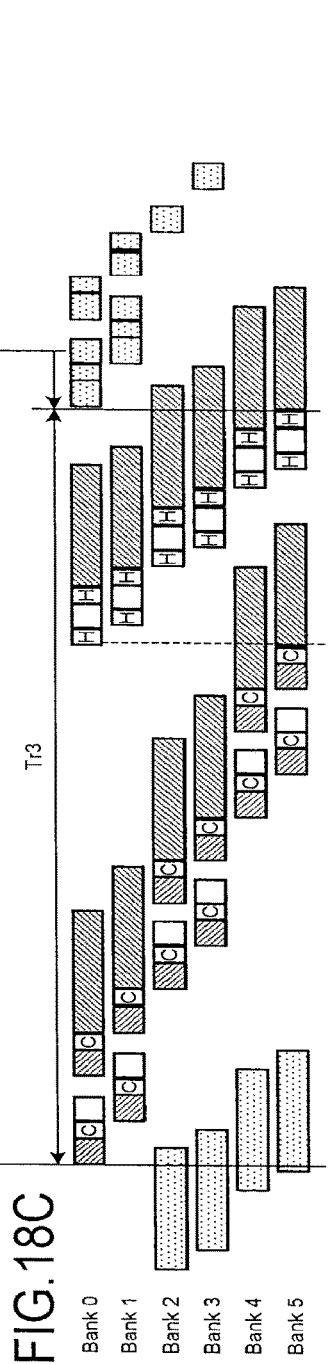

MEMORY SYSTEM CONTROLLING INTERLEAVING WRITE TO MEMORY CHIPS

CROSS-REFERENCE TO RELATED APPLICATIONS

This application is a continuation of U.S. application Ser. No. 14/447,810 filed Jul. 31, 2014, and is based upon and claims the benefit of priority from U.S. Provisional Patent Application No. 61/951,367, filed on Mar. 11, 2014; the entire contents of each of which are incorporated herein by reference.

FIELD

Embodiments described herein relate generally to a memory system including a non-volatile memory, a memory controller, and a control method of a non-volatile memory.

BACKGROUND

Bank interleaving achieves a high-speed process by driving a plurality of memory chips in parallel, the plurality of memory chips being connected to one common IO bus. The plurality of memory chips belongs to different banks.

In an MLC (Multiple Level Cell) flash memory, the time required to write an upper page is several times longer than the time required to write a lower page.

In scheduling of bank interleaving, the order of writing between banks and the order of writing between pages are determined. An increase in the usage ratio of a plurality of banks is important to increase the write throughput. Hence, such scheduling of bank interleaving as to increase the usage ratio of the plurality of banks as high as possible is desired.

BRIEF DESCRIPTION OF THE DRAWINGS

FIGS. 9A to 9C are time charts of when a random write is performed in the scheduling illustrated in FIG. 7A, when a random write is performed in the scheduling illustrated in FIG. 7B, and when a random write is performed in the scheduling illustrated in FIG. 7C, respectively;

FIGS. 11A to 11C are time charts of when a sequential write is performed in the scheduling illustrated in FIG. 10A, when a sequential write is performed in the scheduling illustrated in FIG. 10B, and when a sequential write is performed in the scheduling illustrated in FIG. 10C, respectively;

FIGS. 12A to 12C are time charts of when a random write is performed in the scheduling illustrated in FIG. 10A, when a random write is performed in the scheduling illustrated in FIG. 10B, and when a random write is performed in the scheduling illustrated in FIG. 10C, respectively;

FIGS. 14A to 14C are time charts of when a sequential write is performed in the scheduling illustrated in FIG. 13A, when a sequential write is performed in the scheduling illustrated in FIG. 13B, and when a sequential write is performed in the scheduling illustrated in FIG. 13C, respectively;

FIGS. 15A to 15C are time charts of when a random write is performed in the scheduling illustrated in FIG. 13A, when a random write is performed in the scheduling illustrated in FIG. 13B, and when a random write is performed in the scheduling illustrated in FIG. 13C, respectively;

FIGS. 18A to 18C are time charts of when a random write is performed in the scheduling of the first comparative example, when a random write is performed in the scheduling of the second comparative example, and when a random write is performed in the scheduling illustrated in FIG. 16, respectively;

DETAILED DESCRIPTION

In general, according to one embodiment, a memory system includes a non-volatile memory and a controller. The non-volatile memory includes a plurality of memory chips belonging to n (n≥3) banks. Each of the plurality of memory chips includes a plurality of blocks. Each of the plurality of blocks is a data erasing unit. Each of the plurality of blocks includes a plurality of lower pages and a plurality of upper pages. The controller is configured to perform an interleaving write to the n banks via a bus. Each of the n banks belongs to any of a plurality of groups such that a maximum of m (m<n) banks belong to one group. The controller includes a control unit to execute a first process such that writing is performed in an order of page numbers in the memory chip. The first process includes a second process to be executed in an order of group units. The second process includes a process of writing data to the lower pages of the memory chips belonging to the banks in one group, and subsequently writing data to the upper pages of the memory chips belonging to the banks in the group.

Exemplary embodiments of the memory system, the memory controller, and a control method of the non-volatile memory will be explained below in detail with reference to the accompanying drawings. The present invention is not limited to the following embodiments.

First Embodiment

Figure 1:
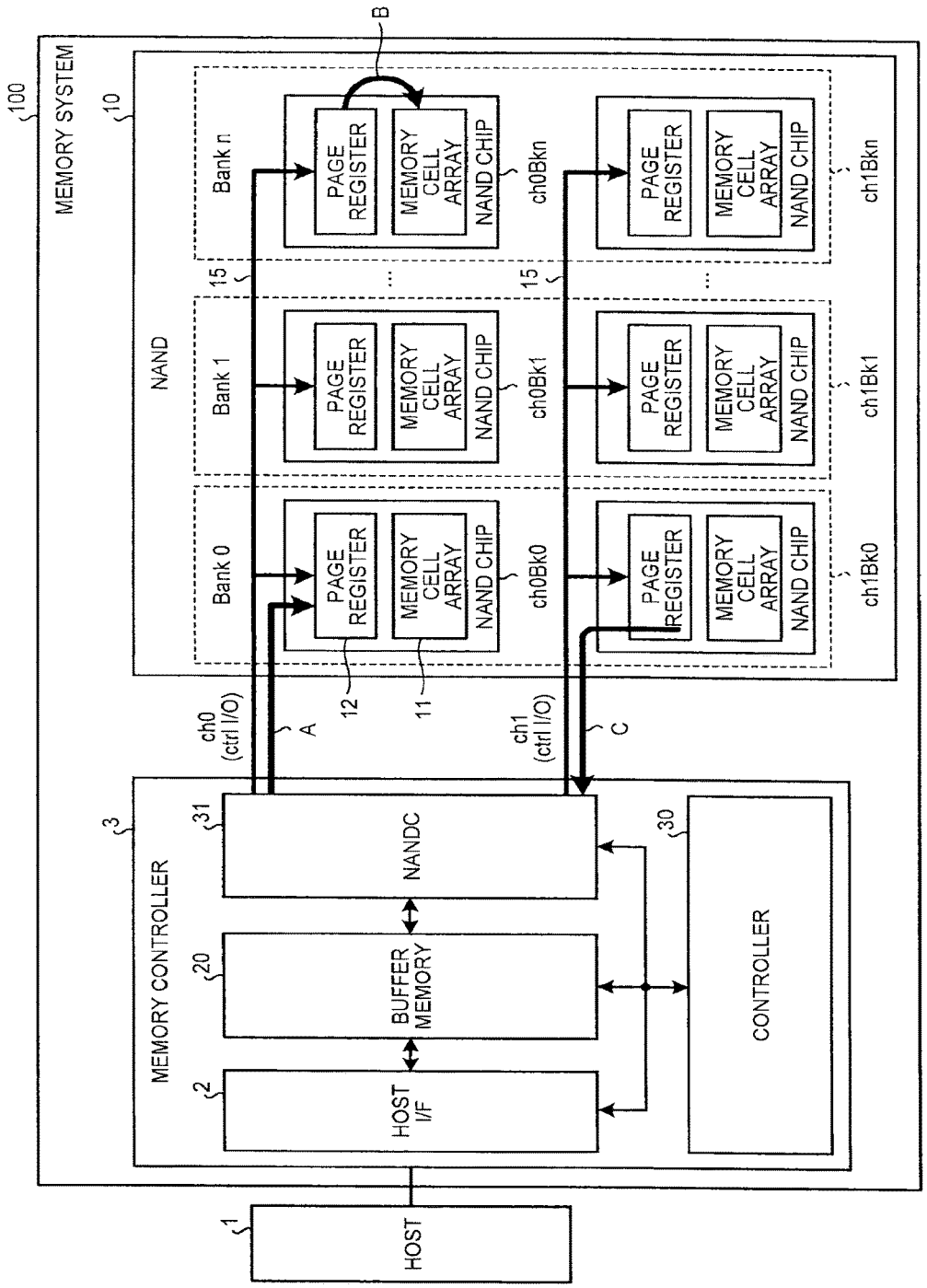
FIG. 1 is a functional block diagram of an internal configuration of a memory system.

FIG. 1 illustrates a configuration example of an SSD (Solid State Drive) 100 being an example of the memory system. The SSD 100 is connected to a host apparatus (hereinafter abbreviated as the host) 1 via a host interface 2, and functions as an external storage device of the host 1. The host 1 is, for example, a personal computer, a mobile phone, or an imaging apparatus.

The SSD 100 includes a NAND flash 10 (hereinafter abbreviated as the NAND) as a non-volatile semiconductor memory, and a memory controller 3. The memory controller 3 includes the host interface 2, a NAND controller (NANDC) 31, a buffer memory 20, and a controller 30. The non-volatile semiconductor memory can be another memory such as a ReRAM (Resistance Random Access Memory) as long as it allows MLC (Multiple Level Cell) storage.

The NAND 10 stores user data transmitted from the host 1, the management information of the user data, system data, and the like. The NAND 10 includes a plurality of memory chips (NAND chips): Ch0Bk0, Ch0Bk1, . . . , Ch0Bkn, Ch1Bk0, Ch1Bk1, . . . , and Ch1Bkn. The plurality of NAND chips included in the NAND 10 executes a bank parallel operation and a channel parallel operation.

One channel includes one control I/O bus (Ctrl I/O) 15 and the plurality of NAND chips sharing one Ctrl I/O bus 15. The channel parallel operation is achieved by operating a plurality of channel components in parallel. In the case of FIG. 1, there are two channels (ch0 and ch1). The NAND 10 may have one channel configuration.

The plurality of (n) NAND chips sharing one Ctrl I/O bus 15 performs interleaving operations to achieve the bank parallel operations. The bank is configured by selecting the NAND chips one by one from each channel. In other words, the number of banks corresponds to the number of NAND chips sharing the Ctrl I/O bus 15. In the case of FIG. 1, there are n banks (Bank 0, Bank 1, . . . , Bank n), and a plurality of NAND chips of the same bank executes the channel parallel operations.

Each NAND chip includes a memory cell array 11 where a plurality of memory cells are arrayed in matrix form, and a page register (page buffer) 12. The page register 12 buffers one page worth of write data to or read data from the memory cell array 11. Each individual memory cell is an MLC storage cell, and can store four values. Each of the memory chips is composed of a plurality of physical blocks, each of the physical blocks being a unit of data erasing. In the NAND 10, data writing and data reading are performed per physical page. The physical block is configured with a plurality of physical pages. One physical page corresponds to a lower page or an upper page. The physical block includes a plurality of lower pages and a plurality of upper pages.

The host I/F 2 receives commands such as a read command and a write command from the host 1 via a communication interface such as an SATA (Serial Advanced Technology Attachment) and an SAS (Serial Attached SCSI). The address, size, data, and the like of data to be transferred by the command are added to the command. When receiving the command from the host 1, the host I/F 2 notifies the controller 30 of the command.

The buffer memory 20 temporarily stores data to be transferred between the host 1 and the NAND 10. For example, an SRAM (Static Random Access Memory) and a DRAM (Dynamic Random Access Memory) are used as the buffer memory 20.

The NANDC 31 includes, for example, a NAND I/F that performs an interface process in between with the NAND 10, an error correction circuit, and a DMA controller, and performs things such as writing to the NAND 10 data temporarily stored in the buffer memory 20, and reading out data stored in the NAND 10 to transfer the data to the buffer memory 20, based on the control of the controller 30.

The controller 30 executes a process of writing data to be written to the NAND 10, to the NAND 10 via the buffer memory 20, and a process of reading from the NAND 10. Moreover, the controller 30 executes compaction or garbage collection in the NAND 10.

In the memory system 100, mainly when a host write or compaction is performed, a write process is performed on the NAND 10.

(Host Write)

The host write is a data write process based on a request of the host 1. The host 1 outputs a write command and write data to the memory system 100. The write data is buffered in the buffer memory 20 in the memory controller 3. When the write data is buffered in the buffer memory 20 to the amount of the write unit to the NAND 10, the controller 30 transfers the data to the page register 12 of the NAND chip via the NANDC 31 and the Ctrl I/O bus 15. In the data transfer, the data transfer from the NANDC 31 to the page register 12 as indicated by the arrow A is called a data-in operation. When data-in is completed, a control circuit (not illustrated) in the NAND chip performs a program operation that stores the data of the page register 12 in the memory cell of the memory cell array 11 as indicated by the arrow B. There is a status read operation that checks the success or failure of the program using the Ctrl I/O bus 15 after the program operation. However, the status read operation can be executed in an extremely short time. Therefore, its description is omitted.

(Compaction)

If the data erasure unit (block) and the data read/write unit are different in the memory system 100, due to repeated rewriting of the NAND 10, the valid data in the blocks becomes more fragmented. When the blocks in such a fragmented state increases, substantially, usable blocks decrease and a storage area of the NAND 10 cannot be effectively used. Therefore, for example, if the number of unused blocks of the NAND 10 is reduced below a predetermined threshold value, compaction is executed in which valid data in a compaction source block is collected to be moved to a compaction destination block. Accordingly, the number of unused blocks is increased.

The data of the compaction source block exists on the NAND 10. Therefore, the data is transferred by a compaction read operation from the NAND chip to the buffer memory 20 in the memory controller 3. Specifically, the compaction read has two stages including a page read operation and a data-out operation. In the page read operation, data is moved from the memory cell array 11 to the page register 12 in the NAND chip. In the data-out operation, data is transferred from the page register 12 in the NAND chip to the buffer memory 20 in the memory controller 3 via the Ctrl I/O bus 15 and the NANDC 31. The time required for the page read operation is relatively shorter than the time required for the data-out operation. Accordingly, with respect to the compaction read, only the data-out operation is hereinafter described. Moreover, data transfer from the page register 12 to the NANDC 31 as indicated by the arrow C is hereinafter called the compaction read.

In compaction, the data-in operation indicated by the arrow A and the program operation indicated by the arrow B are executed as in the host write after data is transferred by the read operation from the NAND chip to the buffer memory 20 in the memory controller 3.

Among the operations of the host write and compaction, the data-in operation and the compaction read occupy the Ctrl I/O bus 15. The program process, however, does not use the Ctrl I/O bus 15. The program process does not occupy the Ctrl I/O bus 15. Accordingly, the parallel operations are possible between the plurality of NAND chips sharing the Ctrl I/O bus 15 with respect to the program process. It can also be said that bank interleaving is to drive the plurality of NAND chips sharing the Ctrl I/O bus 15 to operate the program process in parallel.

On the other hand, in an MLC (Multiple Level Cell) NAND memory, there is generally a large difference between a program time for the lower page and a program time for the upper page: the program time for the upper page>the program time for the lower page. For example, the program time for the lower page is approximately 400 µs, and the program time for the upper page is approximately 2500 µs. The data-in time is approximately 300 µs including a redundant part per 64 KB write data, assuming that the data transfer rate of the Ctrl I/O bus 15 is 266 MB/s. Moreover, the compaction read time is approximately 400 µs.

Focusing on the magnitude relation between the program time of the lower page, the program time of the upper page, the data-in time, and the compaction read time, data-in and the compaction read are performed on the next bank during the program time of the lower page of a certain bank, and the compaction read, data-in, and programming of the lower page are performed on the next bank during the program time of the upper page of a certain bank.

Accordingly, when a bank interleaving is performed, the I/O bus is effectively used to improve the effective parallelism of the NAND chips.

When the host write is performed by bank parallel processing, data-in is performed on the next bank during the program time of the lower page of a certain bank, and the data-in of the next bank, and programming of the lower page of the next bank are performed during the program time of the upper page of a certain bank.

When compaction is performed by the bank parallel operation, the compaction read and data-in of the next bank are performed during the program time of the lower page of a certain bank, and the compaction read of the next bank, data-in of the next bank, and programming of the lower page of the next bank are performed during the program time of the upper page of a certain bank.

The controller 30 controls the order of writing between banks and the order of writing between pages upon bank interleaving in accordance with the scheduling of the embodiment, as described below. Before the description of the scheduling of the embodiment, scheduling of a first comparative example and a second comparative example is described.

Figure 2:
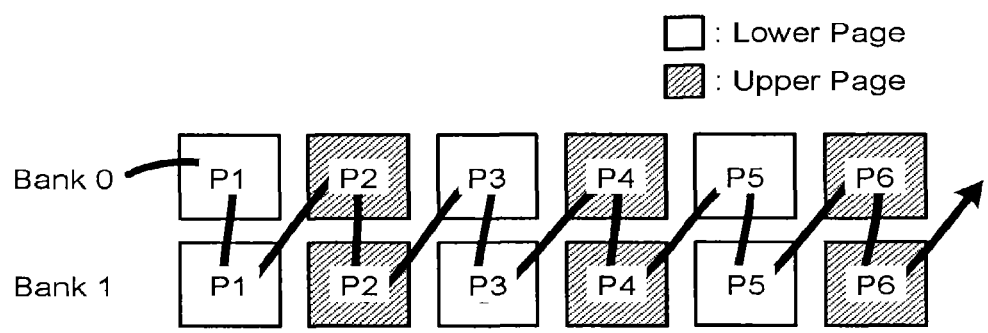
FIG. 2 is a diagram illustrating scheduling in a first comparative example.

FIG. 2 illustrates the scheduling of two bank interleaving in the first comparative example (normal pattern). In FIG. 2, the unhatched squares represent the lower pages, and the hatched squares represent the upper pages. The start page number in the block is page number 0. Pi denotes a page with page number i. The arrow in FIG. 2 represents the time order of write processes. In the first comparative example, the process is shifted to the next bank page by page.

In other words, in the first comparative example, after P1 (the lower pages) of all the banks are written, P2 (the upper pages) of all the banks are written. The processes are repeated from then on. In a case of two banks in the first comparative example, writing is performed on L, L, U, U, L, L, U, U, . . . , where L denotes the lower page, and U denotes the upper page.

Figure 3:
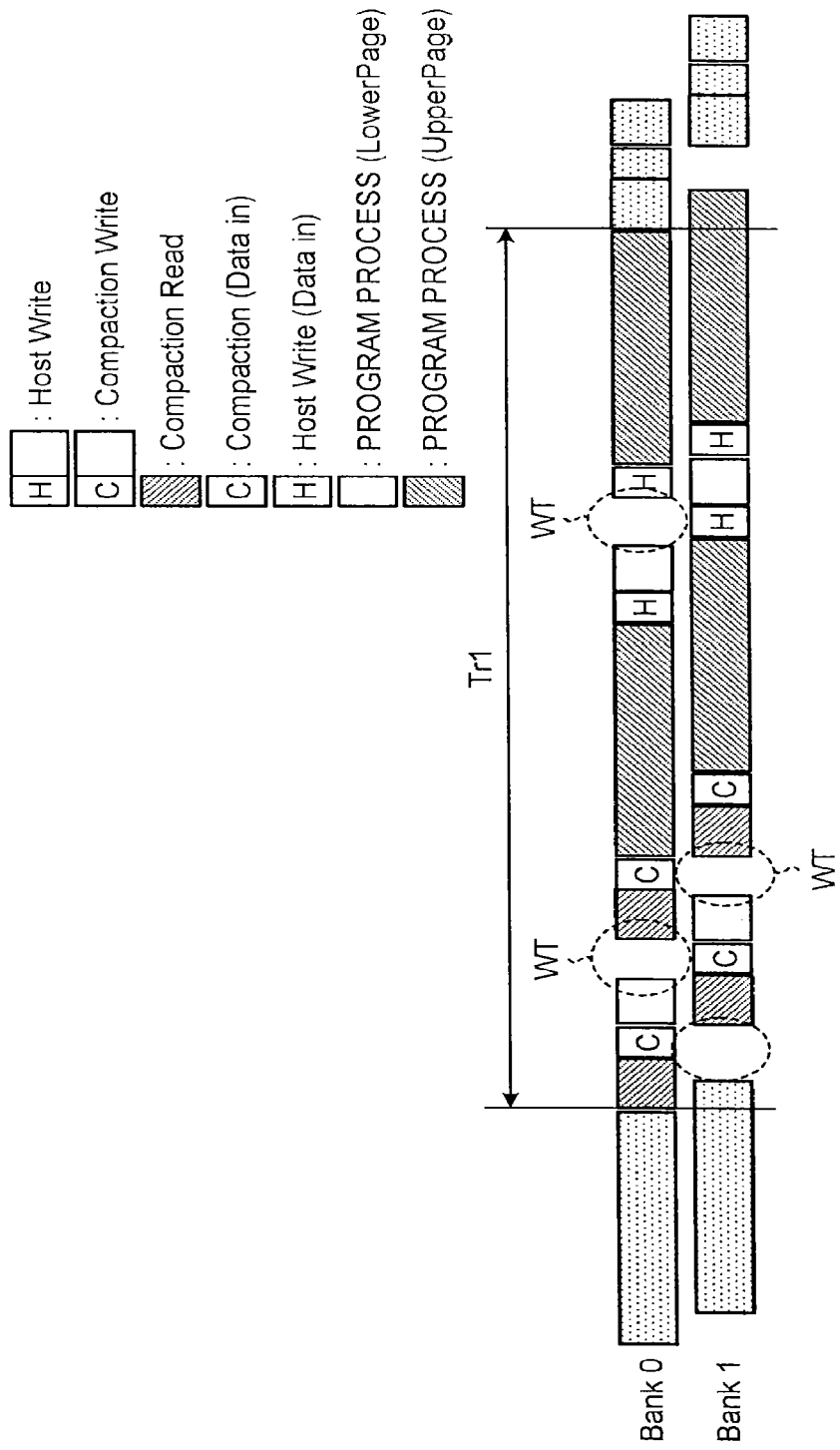
FIG. 3 is a time chart of when a random write is performed in the scheduling illustrated in FIG. 2.

FIG. 3 is a time chart illustrating an example of a random write process in the first comparative example. In the specification, the random write indicates a mixed process of compaction and the host write. In the random write described below, the following processes are serially performed on each bank.

(1) Compaction read, and compaction write to the lower page (2) Compaction read, and compaction write to the upper page (3) Host write to the lower page (4) Host write to the upper page In contrast, in the specification, a sequential write indicates a process including only the host write.

In the first comparative example, a wasted time WT during which the program process of another bank cannot be performed in parallel occurs at the time of data-in of the compaction write and at the time of data-in of the host write. Hence, an operating cycle Tr1 of the random write in the first comparative example includes the wasted time WT. In this manner, the scheduling of the first comparative example has a problem that the operating cycle Tr1 of the random write is long.

Figure 4:
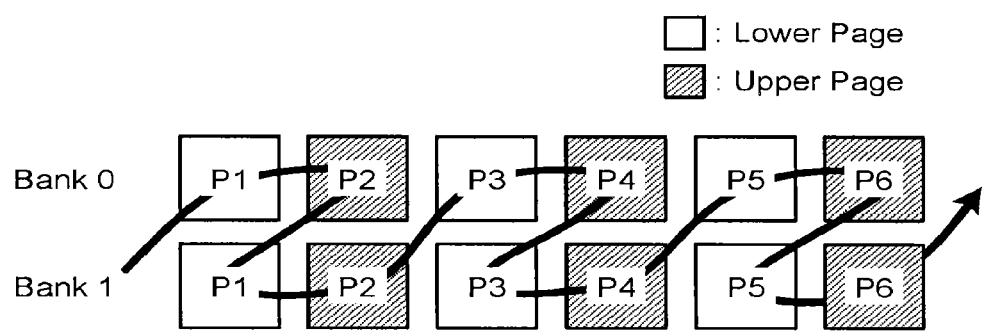
FIG. 4 is a diagram illustrating scheduling in a second comparative example.

FIG. 4 illustrates the scheduling of two bank interleaving in the second comparative example (zigzag pattern). In the second comparative example, the program process is shifted to the next bank per two pages including the lower and upper pages.

In other words, in the second comparative example, P1 (the lower page) of a certain bank 0 is written, and P2 (the upper page) of the same bank 0 is then written. P1 (the lower page) of the next bank 1 is then written. P2 (the upper page) of the same bank 1 is then written. Such writing is repeated. In a case of two banks in the second comparative example, writing is performed on L, U, L, U, L, U, L, U, . . . .

Figure 5:
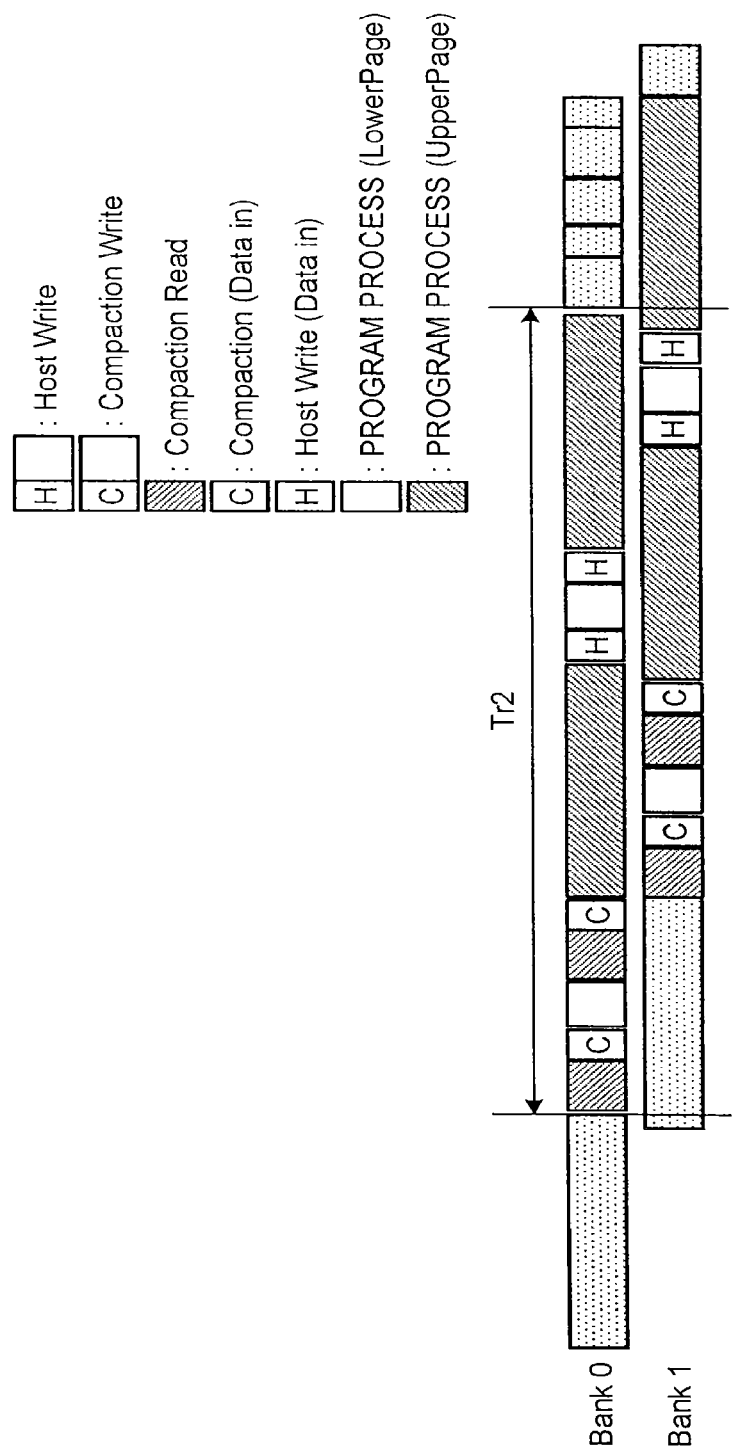
FIG. 5 is a time chart of when a random write is performed in the scheduling illustrated in FIG. 4.

FIG. 5 is a time chart illustrating an example of the random write process in the second comparative example. In the case of the second comparative example, the wasted time WT, which occurs in the first comparative example, does not occur, and an operating cycle Tr2 of the random write is shorter than the operating cycle Tr1 of the first comparative example.

However, the scheduling of the second comparative example is effective in the case of two bank interleaving, but has a problem that the operating cycle is long in a case of three or more banks as described below.

Figure 6:
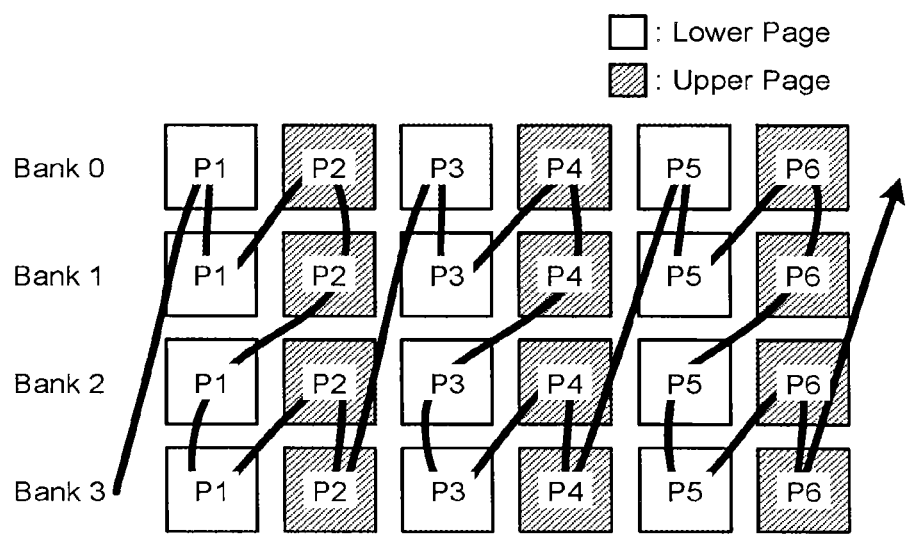
FIG. 6 is a diagram illustrating scheduling for four bank interleaving in a first embodiment.

FIG. 6 is a diagram illustrating the scheduling of bank interleaving in the first embodiment, the scheduling being performed by the controller 30. FIG. 6 illustrates an example of the scheduling of four bank interleaving. In the first embodiment, in the case of four banks, a repeated operation of P1 (lower page) of bank 0→P1 (lower page) of bank 1→P2 (upper page) of bank 0→P2 (upper page) of bank 1→P1 (lower page) of bank 2→P1 (lower page) of bank 3→P2 (upper page) of bank 2→P2 (upper page) of bank 3→ . . . is performed.

In other words, in the scheduling of the first embodiment, banks 0 and 1 belong to a first group, and banks 2 and 3 belong to a second group. In the first embodiment, the magnitude relation between the program time of the lower page, the program time of the upper page, the data-in time, the compaction read time are taken into account. It is set such that the number of m banks belonging to one group is two at the maximum. If the total number of banks is an odd number, there is also a group constituted by one bank.

In the first embodiment, a first process is executed in the order of page numbers in the memory chip. In FIG. 6, the first process corresponds to, for example, the program process on P1 and P2 of banks 0 to 3. The first process includes a second process to be executed on a group-by-group basis. The second process includes, for example, the program process on P1 and P2 of the first group to which banks 0 and 1 belong. The second process includes, for example, the program process on P1 and P2 of the second group to which banks 2 and 3 belong. The second process includes writing data in the lower pages of the memory chips belonging to the banks in one group, and subsequently writing data in the upper pages belonging to the banks in the group.

(Four Bank Interleaving n=4 m=2)

Figure 7A:
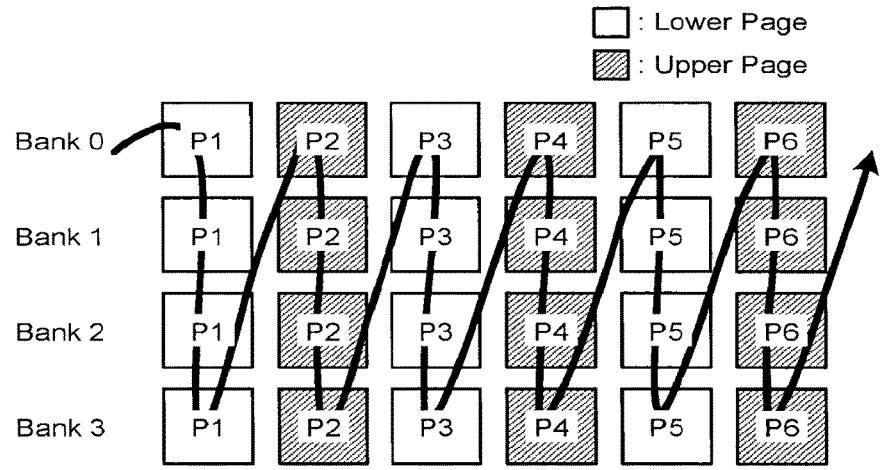
FIGS. 7A to 7C are diagrams illustrating scheduling for four bank interleaving in the first comparative example, scheduling for four bank interleaving in the second comparative example, and the scheduling for four bank interleaving in the first embodiment, respectively.
Figure 7B:
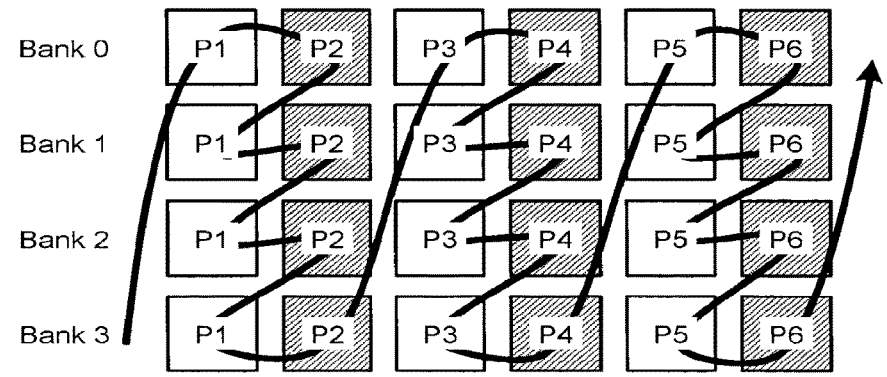
Figure 7C:
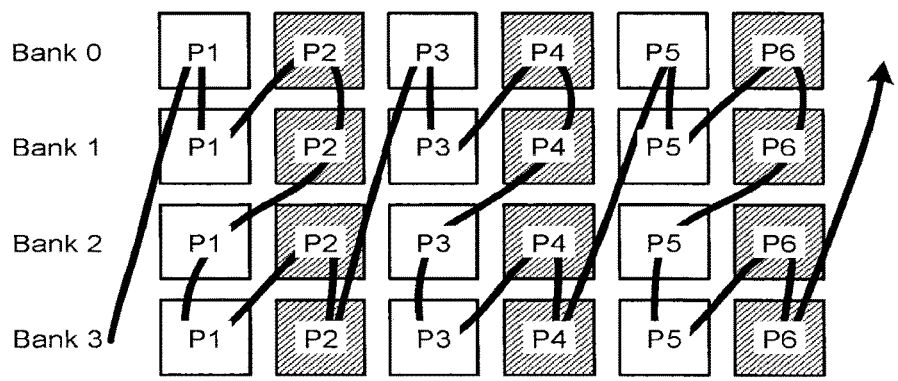

FIGS. 7A to 7C illustrate scheduling for four bank interleaving. FIGS. 7A to 7C illustrate scheduling in the first comparative example, scheduling in the second comparative example, and scheduling in the first embodiment, respectively.

Figure 8A:
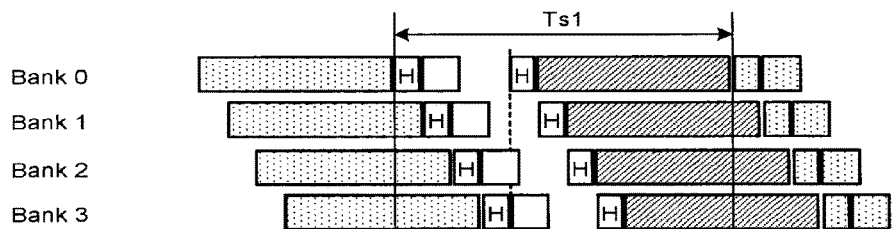
FIGS. 8A to 8C are time charts of when a sequential write is performed in the scheduling illustrated in FIG. 7A, when a sequential write is performed in the scheduling illustrated in FIG. 7B, and when a sequential write is performed in the scheduling illustrated in FIG. 7C, respectively.
Figure 8B:
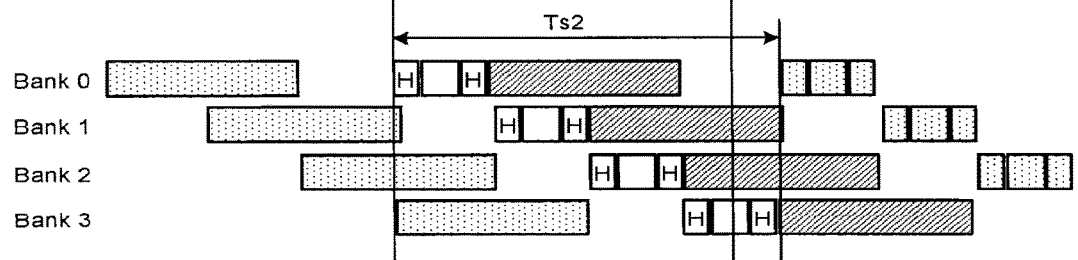
Figure 8C:
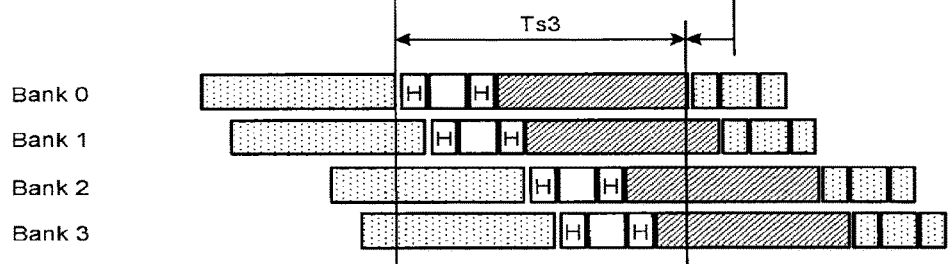

FIGS. 8A to 8C illustrate time charts of bank interleaving of when the sequential write including only the host write is performed in the scheduling illustrated in FIGS. 7A to 7C. FIG. 8A corresponds to FIG. 7A. FIG. 8B corresponds to FIG. 7B. FIG. 8C corresponds to FIG. 7c.

The operation of the sequential write illustrated in FIG. 8C is described. Pieces of write data transmitted from the host 1 are sequentially buffered in the buffer memory 20 in the memory controller 3, and then written to the NAND 10. A description is given here assuming that the write operation begins at page number 1 (lower) of banks 0 to 3 of the NAND 10.

1) Data-in is initiated for P1 (lower) of bank 0.
2) After the end of the data-in for P1 (lower) of bank 0, programming of P1 (lower) of bank 0 is initiated. At the same time, data-in is initiated for P1 (lower) of bank 1.
3) After the end of the data-in for P1 (lower) of bank 1, programming of P1 (lower) of bank 1 is initiated.
4) After the end of the programming of P1 of bank 0, data-in is initiated for P2 (upper) of bank 0.
5) After the end of the data-in for P2 (upper) of bank 0, programming of P2 (upper) of bank 0 is initiated. At about the time the data-in for P2 (upper) of bank 0 is completed, the programming of P1 (lower) of bank 1 has completed. Therefore, data-in for P2 (upper) of bank 1 is initiated.
6) After the end of the data-in for P2 (upper) of bank 1, programming of P2 (upper) of bank 1 is initiated. At the same time, data-in is initiated for P1 (lower) of bank 2.
7) After the end of the data-in for P1 (lower) of bank 2, programming of P1 (lower) of bank 2 is initiated. At the same time, data-in is initiated for P1 (lower) of bank 3.
8) After the end of the data-in for P1 (lower) of bank 3, programming of P1 (lower) of bank 3 is initiated.
9) After the end of the programming of P1 (lower) of bank 2, data-in is initiated for P2 (upper) of bank 2.
10) After the end of the data-in for P2 (upper) of bank 2, programming of P2 (upper) of bank 2 is initiated.
11) After the end of the programming of P1 (lower) of bank 3, data-in is initiated for P2 (upper) of bank 3.
12) After the end of the data-in for P2 (upper) of bank 3, programming of P2 (upper) of bank 3 is initiated. After the end of the programming of P2 (upper) of bank 3, similar operations are repeated from 1) (the page number advances two pages at a time).

In the case of the scheduling of the first embodiment illustrated in FIG. 8C, the wasted time is not included in an operating cycle Ts3 of the sequential write. The wasted time is included in an operating cycle Ts1 of the case of the scheduling of the first comparative example illustrated in FIG. 8A, and an operating cycle Ts2 of the case of the scheduling of the second comparative example illustrated in FIG. 8B. Their relations is expressed as Ts3<Ts1<Ts2.

FIGS. 9A to 9C illustrate time charts of bank interleaving of when the random write including compaction and the host write is performed in the scheduling illustrated in FIGS. 7A to 7C. FIG. 9A corresponds to FIG. 7A. FIG. 9B corresponds to FIG. 7B. FIG. 9C corresponds to FIG. 7c.

The operation of the random write illustrated in FIG. 9C is described.

1) The compaction read is initiated at any of banks 0 to 3.
2) After the end of the compaction read, data-in of compaction for P1 (lower) of bank 0 is initiated.
3) After the end of the data-in for P1 (lower) of bank 0, programming of P1 (lower) of bank 0 is initiated. At the same time, the compaction read is initiated at any of banks 0 to 3.
4) After the end of the compaction read, data-in of compaction for P1 (lower) of bank 1 is initiated.
5) After the end of the data-in for P1 (lower) of bank 1, programming of P1 (lower) of bank 1 is initiated. Moreover, the compaction read is initiated at a bank other than bank 1.

6) After the end of the compaction read, data-in of compaction for P2 (upper) of bank 0 is initiated.

7) After the end of the data-in for P2 (upper) of bank 0, programming of P2 (upper) of bank 0 is initiated. Moreover, the compaction read is initiated at a bank other than bank 0.

8) After the end of the compaction read, data-in of compaction for P2 (upper) of bank 1 is initiated.

9) After the end of the data-in for P2 (upper) of bank 1, programming of P2 (upper) of bank 1 is initiated. At the same time, the compaction read is initiated at a bank other than banks 0 and 1.

10) After the end of the compaction read, data-in of compaction for P1 (lower) of bank 2 is initiated.

11) After the end of the data-in for P1 of bank 2, programming of P1 (lower) of bank 2 is initiated. Moreover, the compaction read is initiated at a bank other than banks 0, 1 and 2.

12) After the end of the compaction read, data-in of compaction for P1 (lower) of bank 3 is initiated.

13) After the end of the data-in for P1 (lower) of bank 3, programming of P1 (lower) of bank 3 is initiated. Moreover, the compaction read is initiated at a bank other than banks 1 and 3.

14) After the end of the compaction read, data-in of compaction for P2 (upper) of bank 2 is initiated.

15) After the end of the data-in for P2 (upper) of bank 2, programming of P2 (upper) of bank 2 is initiated. At the same time, the compaction read is initiated at any of banks 0 to 3.

16) After the end of the compaction read, data-in of compaction for P2 (upper) of bank 3 is initiated.

17) After the end of the data-in for P2 (upper) of bank 3, programming of P2 (upper) of bank 3 is initiated. At this point in time, the programming of P2 (upper) of bank 0 has completed. Accordingly, data-in of the host write for P3 (upper) of bank 0 is initiated at this point in time.

18) After the end of the data-in for P3 (lower) of bank 0, programming of P3 (lower) of bank 0 is initiated. At the same time, data-in of the host write for P3 (lower) of bank 1 is initiated.

19) After the end of the data-in for P3 (lower) of bank 1, programming of P3 (lower) of bank 1 is initiated.

20) After the end of the programming of P3 of bank 0, data-in of the host write for P4 (upper) of bank 0 is initiated.

21) After the end of the data-in for P4 (upper) of bank 0, programming of P4 (upper) of bank 0 is initiated. At about the time the data-in for P4 (upper) of bank 0 is completed, the programming of P3 (lower) of bank 1 has completed. Therefore, data-in of the host write for P4 (upper) of bank 1 is initiated.

22) After the end of the data-in for P4 (upper) of bank 1, programming of P4 (upper) of bank 1 is initiated. At about the time the data-in for P4 (upper) of bank 1 is completed, the programming of P2 (upper) of bank 2 has completed. Therefore, data-in of the host write for P3 (lower) of bank 2 is initiated.

23) After the end of the data-in for P3 (lower) of bank 2, programming of P3 (lower) of bank 2 is initiated. Moreover, when the programming of P2 (upper) of bank 3 is completed, data-in of the host write for P3 (lower) of bank 3 is initiated.

24) After the end of the data-in for P3 (lower) of bank 3, programming of P3 (lower) of bank 3 is initiated.

25) After the end of the programming of P3 (lower) of bank 2, data-in of the host write for P4 (upper) of bank 2 is initiated.

26) After the end of the data-in for P4 (upper) of bank 2, programming of P4 (upper) of bank 2 is initiated.

27) After the end of the programming of P3 (lower) of bank 3, data-in of the host write for P4 (upper) of bank 3 is initiated.

28) After the end of the data-in for P4 (upper) of bank 3, programming of P4 (upper) of bank 3 is initiated. Similar operations are repeated from 1) (the page number advances two pages at a time).

As illustrated in FIGS. 9A to 9C, the operating cycle of the random write when the scheduling of the first comparative example is adopted is denoted by Tr1, the operating cycle of the random write when the scheduling of the second comparative example is adopted is denoted by Tr2, and the operating cycle of the random write when the scheduling of the first embodiment is adopted is denoted by Tr3. Their relation is Tr3<Tr1<Tr2.

(Three Bank Interleaving n=3 m=2)

Figure 10A:
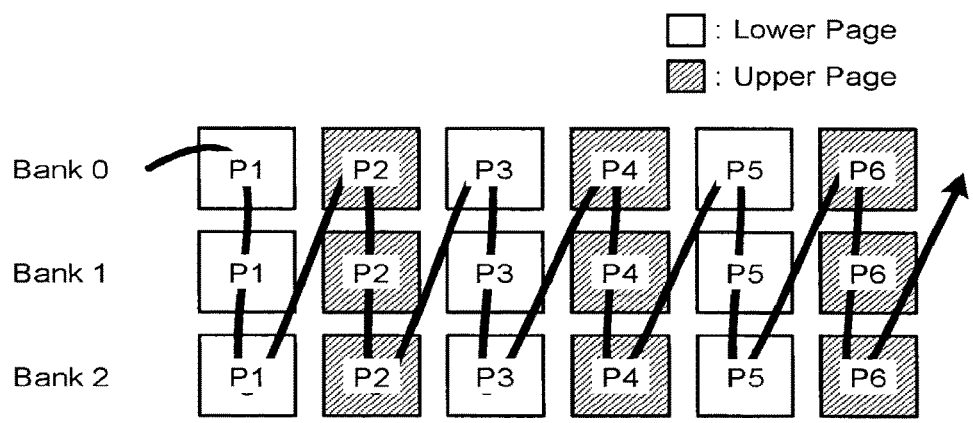
FIGS. 10A to 10C are diagrams illustrating scheduling for three bank interleaving in the first comparative example, scheduling for three bank interleaving in the second comparative example, and scheduling for three bank interleaving in the first embodiment, respectively.
Figure 10B:
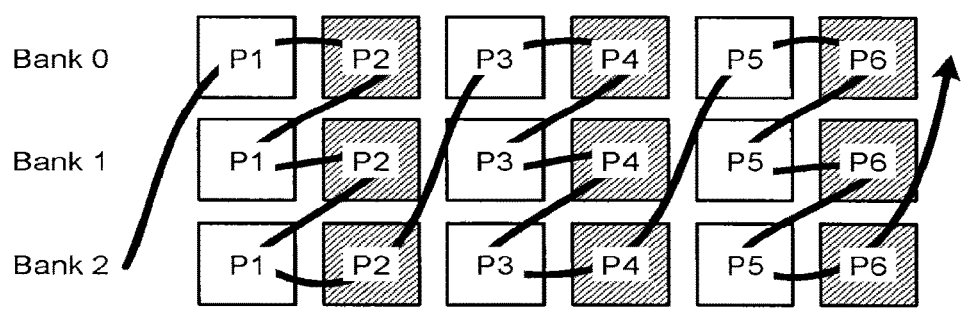
Figure 10C:
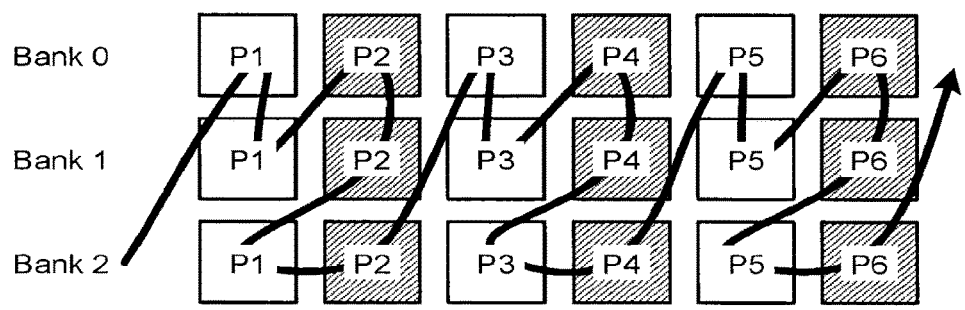

FIGS. 10A to 10C illustrate scheduling for three bank interleaving. FIGS. 10A to 10C illustrate the scheduling in the first comparative example, the scheduling in the second comparative example, and the scheduling in the first embodiment, respectively.

In the scheduling of the first embodiment illustrated in FIG. 10C, a repeated operation of P1 (lower page) of bank 0→P1 (lower page) of bank 1→P2 (upper page) of bank 0→P2 (upper page) of bank 1→P1 (lower page) of bank 2→P2 (upper page) of bank 2→ . . . is performed.

FIGS. 11A to 11C illustrate time charts of bank interleaving when the sequential write is performed in the scheduling illustrated in FIGS. 10A to 10C. FIG. 11A corresponds to FIG. 10A. FIG. 11B corresponds to FIG. 10B. FIG. 11C corresponds to FIG. 10C. In a case of a three bank interleaving sequential write, their relation is Ts3≈Ts2<Ts1.

FIGS. 12A to 12C illustrate time charts of bank interleaving when the random write is performed in the scheduling illustrated in FIGS. 10A to 10C. FIG. 12A corresponds to FIG. 10A. FIG. 12B corresponds to FIG. 10B. FIG. 12C corresponds to FIG. 10C. In a case of a three bank interleaving random write, their relation is Tr3<Tr2<Tr1.

(Five Bank Interleaving n=5 m=2)

Figure 13A:
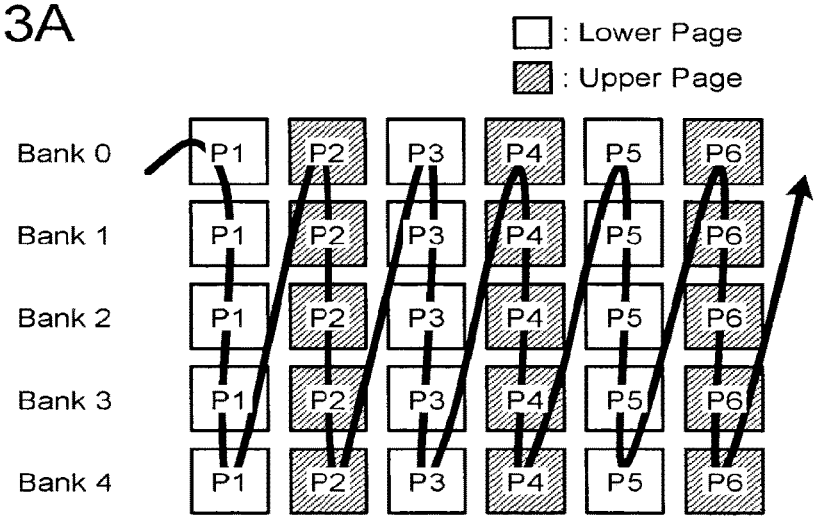
FIGS. 13A to 13C are diagrams illustrating scheduling for five bank interleaving in the first comparative example, scheduling for five bank interleaving in the second comparative example, and scheduling for five bank interleaving in the first embodiment, respectively.
Figure 13B:
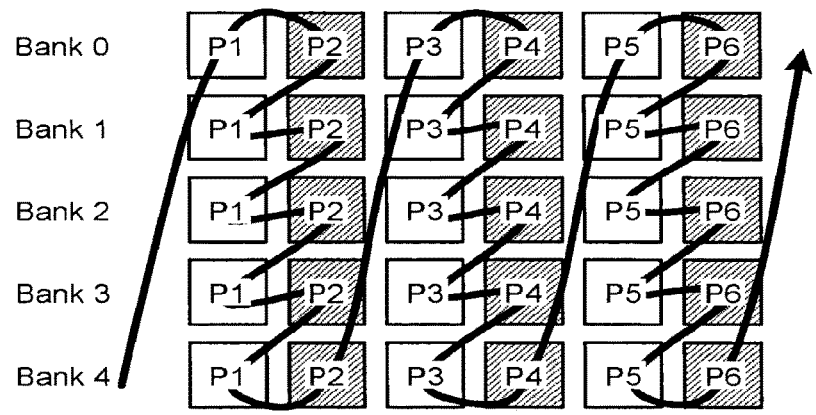
Figure 13C:
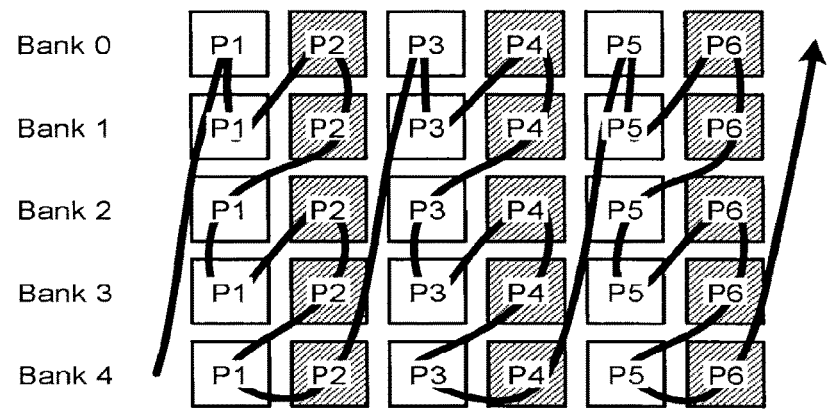

FIGS. 13A to 13C illustrate scheduling for five bank interleaving. FIGS. 13A to 13C illustrate the scheduling of the first comparative example, the scheduling of the second comparative example, and the scheduling of the first embodiment, respectively.

In the scheduling of the first embodiment illustrated in FIG. 13C, a repeated operation of P1 (lower page) of bank 0→P1 (lower page) of bank 1→P2 (upper page) of bank 0→P2 (upper page) of bank 1→P1 (lower page) of bank 2→P1 (lower page) of bank 3→P2 (upper page) of bank 2→P2 (upper page) of bank 3→P1 (lower page) of bank 4→P2 (upper page) of bank 4→ . . . is performed.

FIGS. 14A to 14C illustrate time charts of bank interleaving when the sequential write is performed in the scheduling illustrated in FIGS. 13A to 13C. FIG. 14A corresponds to FIG. 13A. FIG. 14B corresponds to FIG. 13B. FIG. 14C corresponds to FIG. 13c. In a case of a five bank interleaving sequential write, their relation is Ts3<Ts1<Ts2.

FIGS. 15A to 15C illustrate time charts of bank interleaving when the random write is performed in the scheduling illustrated in FIGS. 13A to 13C. FIG. 15A corresponds to FIG. 13A. FIG. 15B corresponds to FIG. 13B. FIG. 15C corresponds to FIG. 13C. In a case of a five bank interleaving random write, their relation is Tr3<Tr1<Tr2.

(Six Bank Interleaving n=6 m=2)

Figure 16:
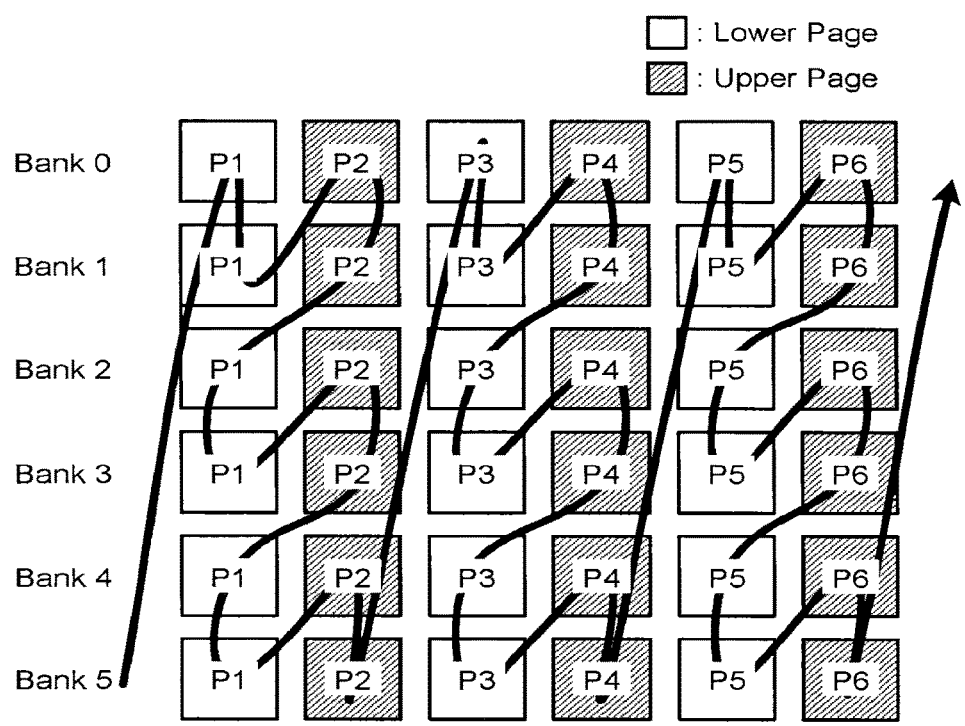
FIG. 16 is a diagram illustrating scheduling for six bank interleaving in the first embodiment.

FIG. 16 illustrates scheduling for six bank interleaving in the first embodiment. In the scheduling illustrated in FIG. 16, a repeated operation of P1 (lower page) of bank 0→P1 (lower page) of bank 1→P2 (upper page) of bank 0→P2 (upper page) of bank 1→P1 (lower page) of bank 2→P1 (lower page) of bank 3→P2 (upper page) of bank 2→P2 (upper page) of bank 3→P1 (lower page) of bank 4→P1 (lower page) of bank 5→P2 (upper page) of bank 4→P2 (upper page) of bank 5→ . . . is performed.

Figure 17A:
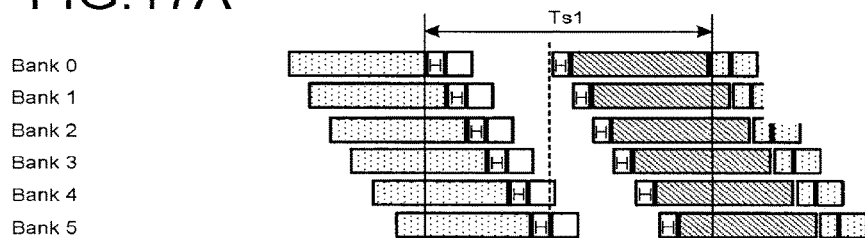
FIGS. 17A to 17C are time charts of when a sequential write is performed in the scheduling of the first comparative example, when a sequential write is performed in the scheduling of the second comparative example, and when a sequential write is performed in the scheduling illustrated in FIG. 16, respectively.
Figure 17B:
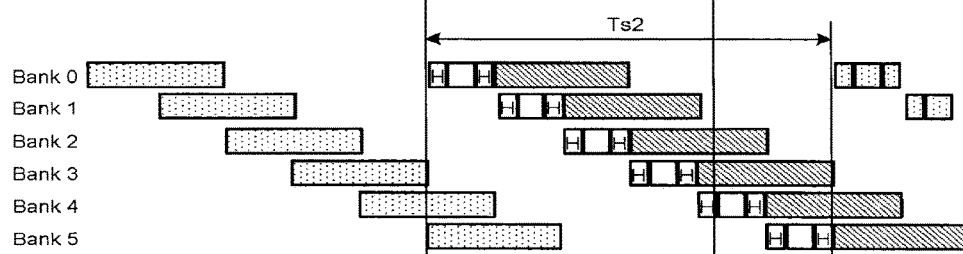
Figure 17C:
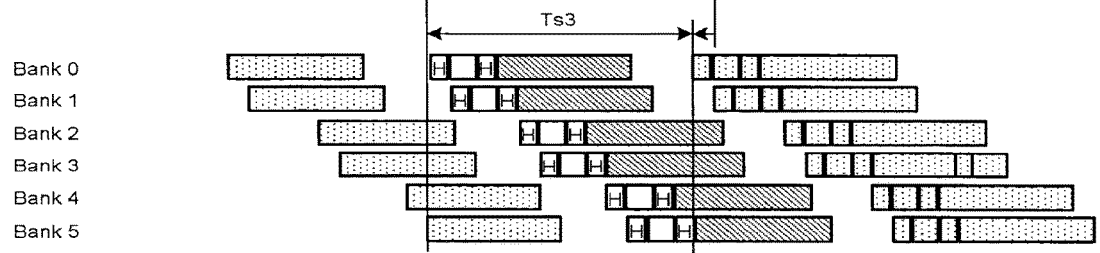

FIG. 17A illustrates a time chart of six bank interleaving when the sequential write is performed in the scheduling of the first comparative example. FIG. 17B illustrates a time chart of six bank interleaving when the sequential write is performed in the scheduling of the second comparative example. FIG. 17C illustrates a time chart of six bank interleaving when the sequential write is performed in the scheduling of the first embodiment. In a case of a six bank interleaving sequential write, their relation is Ts3<Ts1<Ts2.

FIG. 18A illustrates a time chart of six bank interleaving when the random write is performed in the scheduling of the first comparative example. FIG. 18B illustrates a time chart of six bank interleaving when the random write is performed in the scheduling of the second comparative example. FIG. 18C illustrates a time chart of six bank interleaving when the random write is performed in the scheduling of the first embodiment. In a case of a six bank interleaving random write, their relation is Ts3<Ts1<Ts2.

(Eight Bank Interleaving n=8 m=2)

Figure 19:
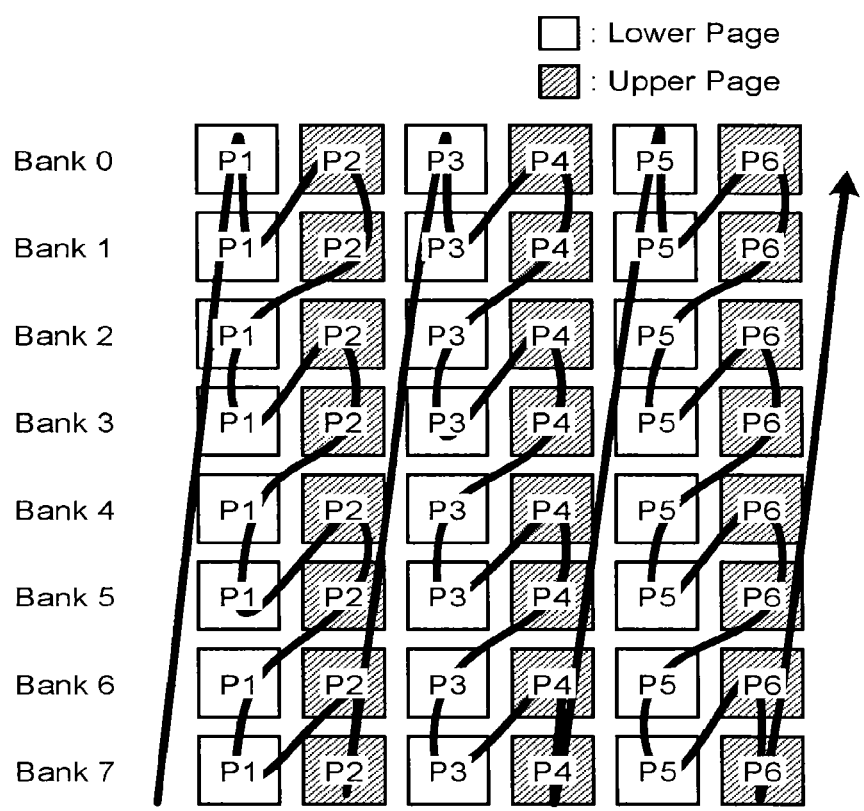
FIG. 19 is a diagram illustrating scheduling for six bank interleaving in the first embodiment.

FIG. 19 illustrates scheduling for eight bank interleaving in the first embodiment. In the scheduling illustrated in FIG. 19, a repeated operation of P1 (lower page) of bank 0→P1 (lower page) of bank 1→P2 (upper page) of bank 0→P2 (upper page) of bank 1→P1 (lower page) of bank 2→P1 (lower page) of bank 3→P2 (upper page) of bank 2→P2 (upper page) of bank 3→P1 (lower page) of bank 4→P1 (lower page) of bank 5→P2 (upper page) of bank 4→P2 (upper page) of bank 5→P1 (lower page) of bank 6→P1 (lower page) of bank 7→P2 (upper page) of bank 6→P2 (upper page) of bank 7→ . . . is performed.

Figure 20:
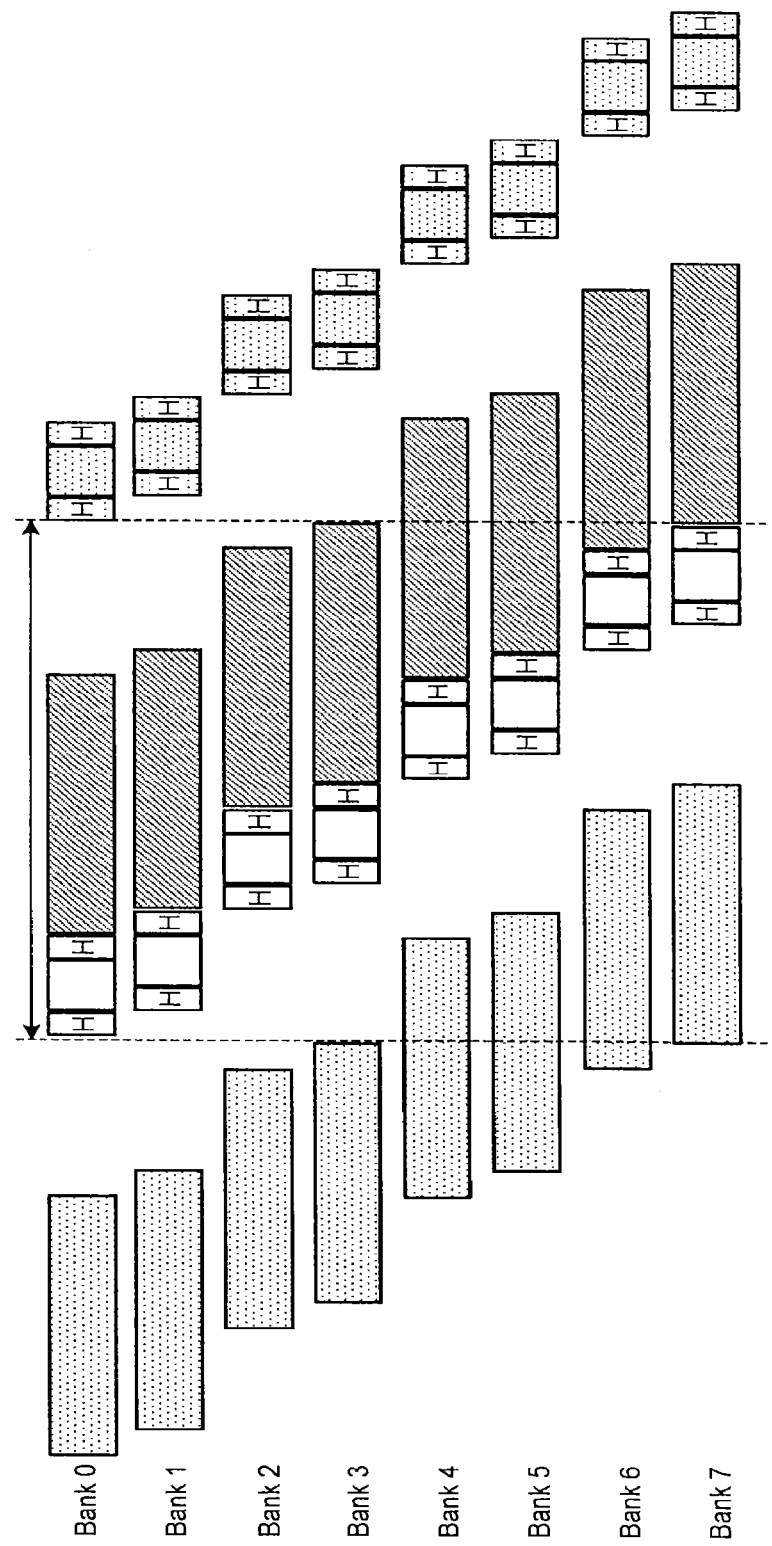
FIG. 20 is a time chart of when a sequential write is performed in the scheduling illustrated in FIG. 19.

FIG. 20 illustrates a time chart of eight bank interleaving when the sequential write is performed in the scheduling illustrated in FIG. 19.

In this manner, in the first embodiment, n banks are divided into a plurality of groups such that two banks belong to one group. In the group, data is written in the lower pages of the memory chips belonging to the banks. Data is subsequently written in the upper pages belonging to the banks in the group. Consequently, in the first embodiment, the usage ratio of each bank increases, which enables the speedup of the write process.

Second Embodiment

In a second embodiment, a description is given of scheduling that is applicable to a case where the data transfer rate of the Ctrl I/O bus 15 is several times higher than that of the first embodiment. The data transfer rate of the Ctrl I/O bus 15 is, for example, 666 MT/s. In the second embodiment, the number of m banks in a group is increased to three or more.

(Four Bank Interleaving n=4 m=3)

Figure 21:
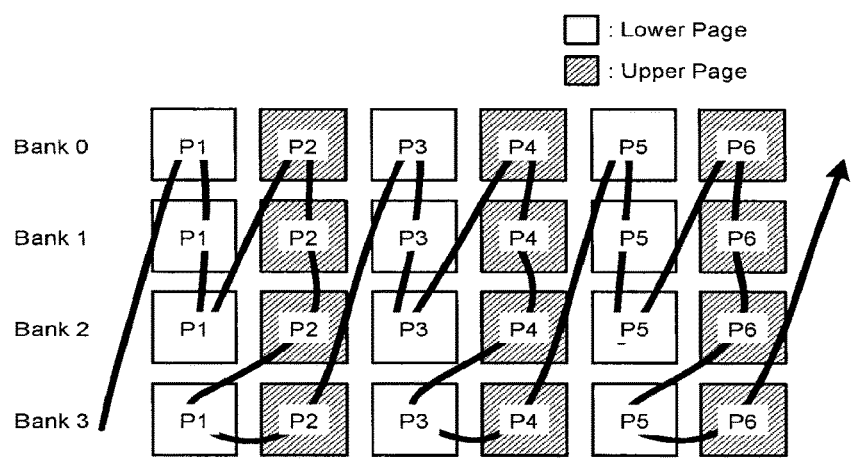
FIG. 21 is a diagram illustrating scheduling for three bank interleaving in a second embodiment.

FIG. 21 illustrates scheduling for four bank interleaving in the second embodiment. In the scheduling illustrated in FIG. 21, a repeated operation of P1 (lower page) of bank 0→P1 (lower page) of bank 1→P1 (lower page) of bank 2→P2 (upper page) of bank 0→P2 (upper page) of bank 1→P2 (upper page) of bank 2→P1 (lower page) of bank 3→P2 (upper page) of bank 3→ . . . is performed.

In the scheduling illustrated in FIG. 21, banks 0, 1, and 2 belong to the first group, and bank 3 belongs to the second group. The number of banks belonging to the first group is set to be three. The number of banks belonging to the second group is set to be one.

Figure 22:
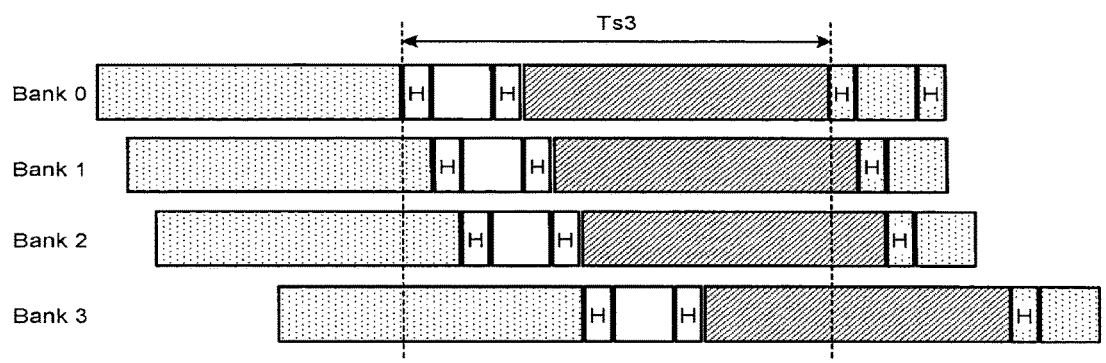
FIG. 22 is a time chart of when a sequential write is performed in the scheduling illustrated in FIG. 21.

FIG. 22 illustrates a time chart of four bank interleaving when the sequential write is performed in the scheduling illustrated in FIG. 21.

(Six Bank Interleaving n=6 m=3)

Figure 23:
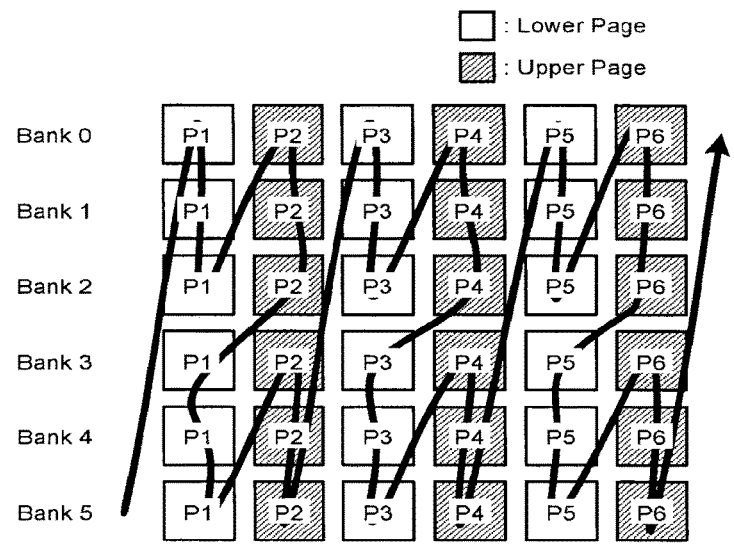
FIG. 23 is a diagram illustrating scheduling for six bank interleaving in the second embodiment.

FIG. 23 illustrates scheduling for six bank interleaving in the second embodiment. In the scheduling illustrated in FIG. 23, a repeated operation of P1 (lower page) of bank 0→P1 (lower page) of bank 1→P1 (lower page) of bank 2→P2 (upper page) of bank 0→P2 (upper page) of bank 1→P2 (upper page) of bank 2→P1 (lower page) of bank 3→P1 (lower page) of bank 4→P1 (lower page) of bank 5→P2 (upper page) of bank 3→P2 (upper page) of bank 4→P2 (upper page) of bank 5→ . . . is performed.

In the scheduling illustrated in FIG. 23, banks 0, 1, and 2 belong to the first group, and banks 3, 4, and 5 belong to the second group. The number of banks belonging to each group is set to be three.

Figure 24:
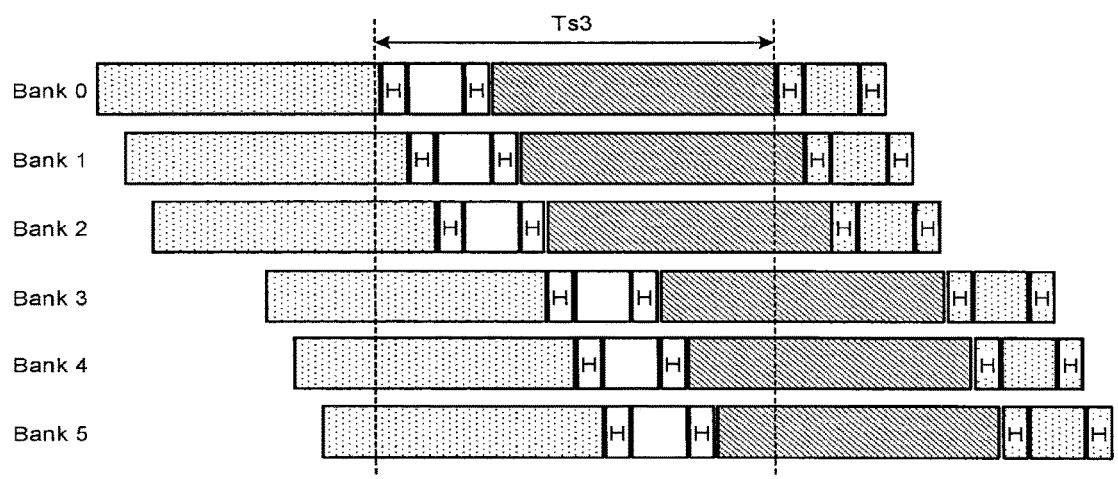
FIG. 24 is a time chart of when a sequential write is performed in the scheduling illustrated in FIG. 23.

FIG. 24 illustrates a time chart of four bank interleaving when the sequential write is performed in the scheduling illustrated in FIG. 23.

(Six Bank Interleaving n=6 m=4)

Figure 25:
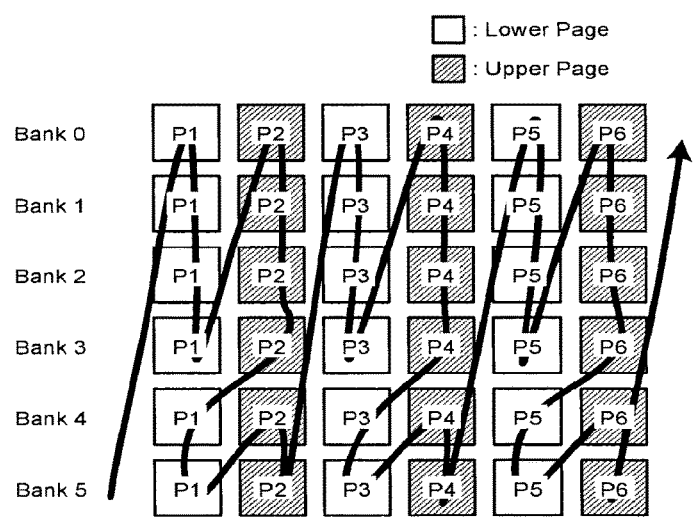
FIG. 25 is a diagram illustrating another scheduling for six bank interleaving in the second embodiment.

FIG. 25 illustrates scheduling for six bank interleaving in the second embodiment. In the scheduling illustrated in FIG. 25, a repeated operation of P1 (lower page) of bank 0→P1 (lower page) of bank 1→P1 (lower page) of bank 2→P1 (lower page) of bank 3→P2 (upper page) of bank 0→P2 (upper page) of bank 1→P2 (upper page) of bank 2→P2 (upper page) of bank 3→P1 (lower page) of bank 4→P1 (lower page) of bank 5→P2 (upper page) of bank 4→P2 (upper page) of bank 5→ . . . is performed.

In the scheduling illustrated in FIG. 25, banks 0, 1, 2, and 3 belong to the first group, and banks 4 and 5 belong to the second group. The number of banks belonging to the first group is set to be four. The number of banks belonging to the second group is set to be two.

Figure 26:
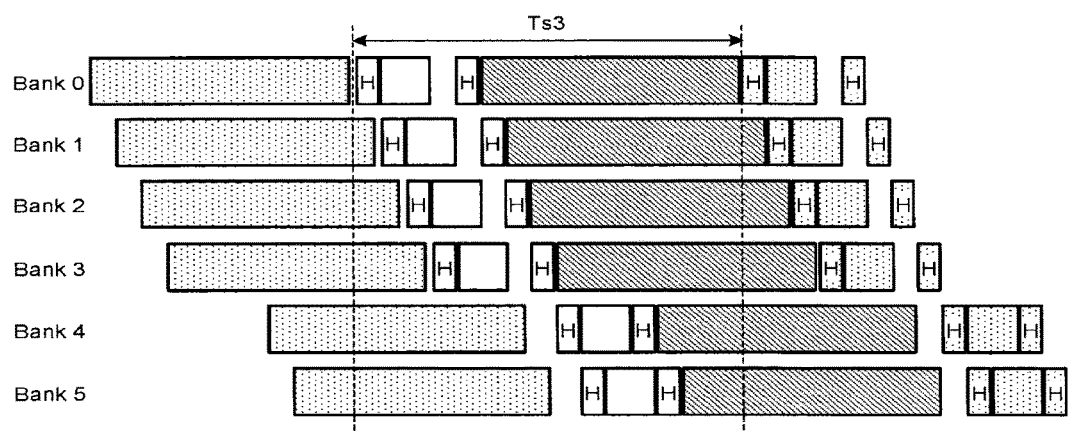
FIG. 26 is a time chart of when a sequential write is performed in the scheduling illustrated in FIG. 25.

FIG. 26 illustrates a time chart of four bank interleaving when the sequential write is performed in the scheduling illustrated in FIG. 25.

(Eight Bank Interleaving n=6 m=3)

Figure 27:
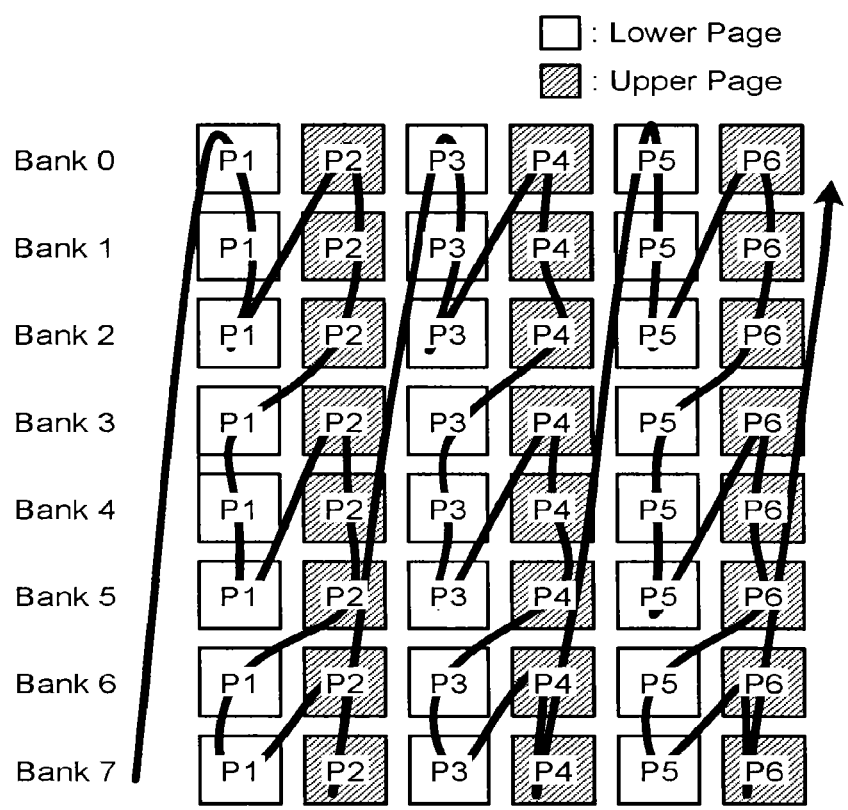
FIG. 27 is a diagram illustrating scheduling for eight bank interleaving in the second embodiment.

FIG. 27 illustrates scheduling for eight bank interleaving in the second embodiment. In the scheduling illustrated in FIG. 27, a repeated operation of P1 (lower page) of bank 0→P1 (lower page) of bank 1→P1 (lower page) of bank 2→P2 (upper page) of bank 0→P2 (upper page) of bank 1→P2 (upper page) of bank 2→P1 (lower page) of bank 3→P1 (lower page) of bank 4→P1 (lower page) of bank 5→P2 (upper page) of bank 3→P2 (upper page) of bank 4→P2 (upper page) of bank 5→P1 (lower page) of bank 6→P1 (lower page) of bank 7→P2 (upper page) of bank 6→P2 (upper page) of bank 7 . . . is performed.

In the scheduling illustrated in FIG. 27, banks 0, 1, and 2 belong to the first group, banks 3, 4, and 5 belong to the second group, and banks 6 and 7 belong to a third group. The numbers of banks belonging to the first group and the second group are set to be three. The number of banks belonging to the third group is set to be two.

Figure 28:
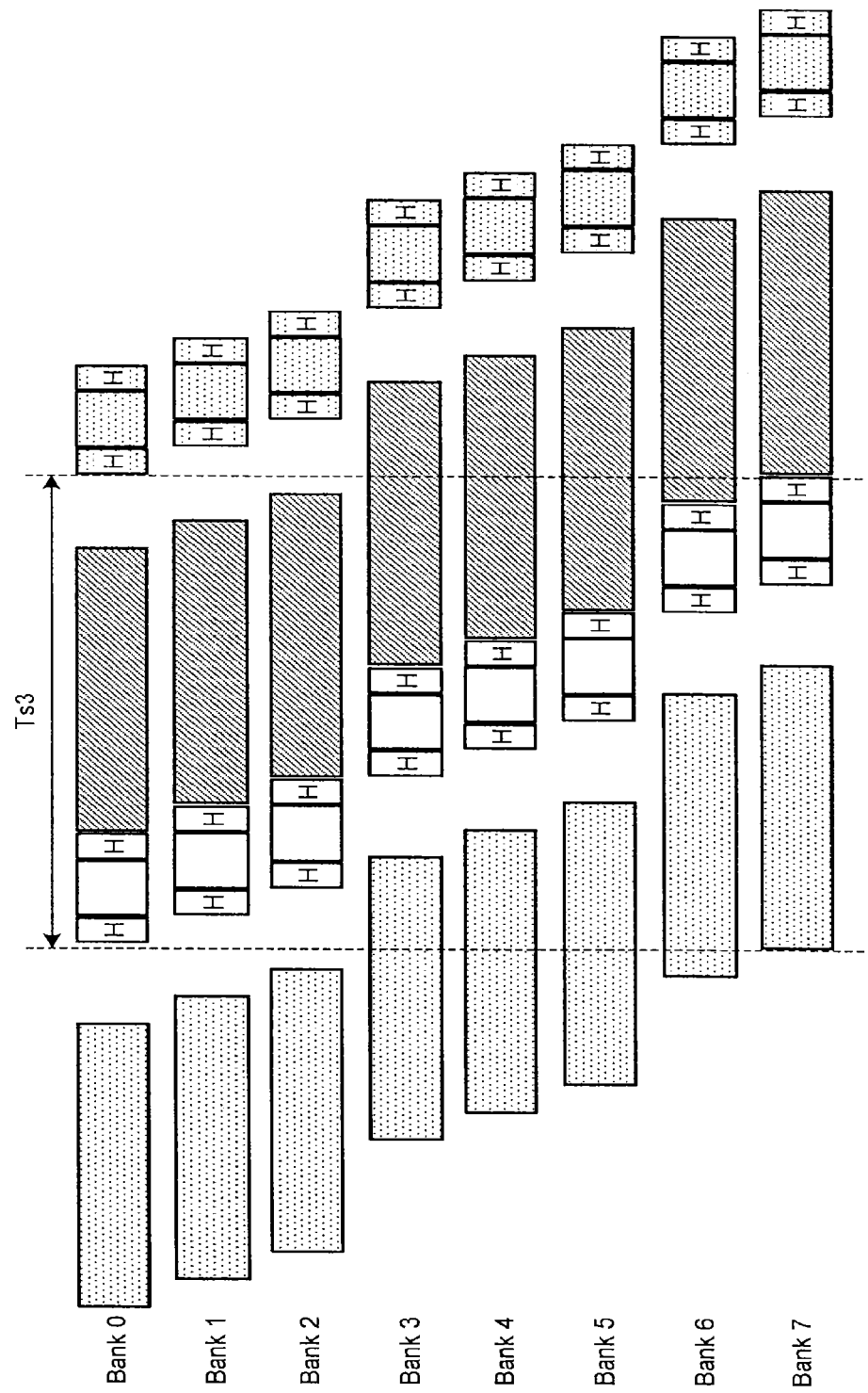
FIG. 28 is a time chart of when a sequential write is performed in the scheduling illustrated in FIG. 27.

FIG. 28 illustrates a time chart of four bank interleaving when the sequential write is performed in the scheduling illustrated in FIG. 27.

(Eight Bank Interleaving n=8 m=4)

Figure 29:
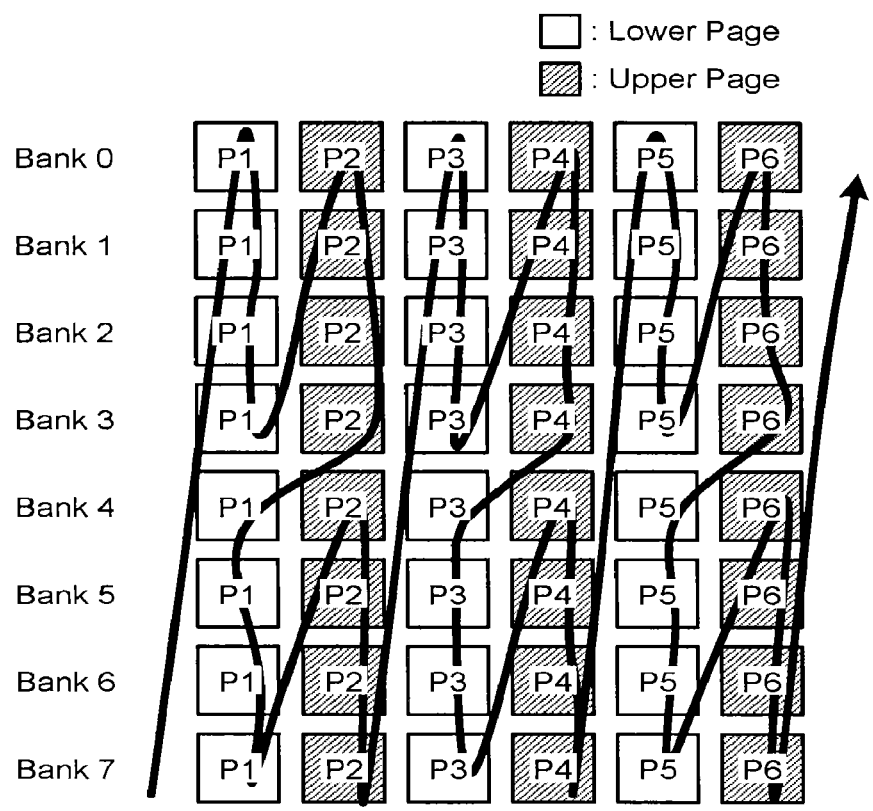
FIG. 29 is a diagram illustrating another scheduling for eight bank interleaving in the second embodiment.

FIG. 29 illustrates scheduling for eight bank interleaving in the second embodiment. In the scheduling illustrated in FIG. 29, a repeated operation of P1 (lower page) of bank 0→P1 (lower page) of bank 1→P1 (lower page) of bank 2→P1 (lower page) of bank 3→P2 (upper page) of bank 0→P2 (upper page) of bank 1→P2 (upper page) of bank 2→P2 (upper page) of bank 3→P1 (lower page) of bank 4→P1 (lower page) of bank 5→P1 (lower page) of bank 6→P1 (lower page) of bank 7→P2 (upper page) of bank 4→P2 (upper page) of bank 5→P2 (upper page) of bank 6→P2 (upper page) of bank 7→ . . . is performed.

In the scheduling illustrated in FIG. 29, banks 0, 1, 2, and 3 belong to the first group, and banks 4, 5, 6, and 7 belong to the second group. The number of banks belonging to each group is set to be four.

Figure 30:
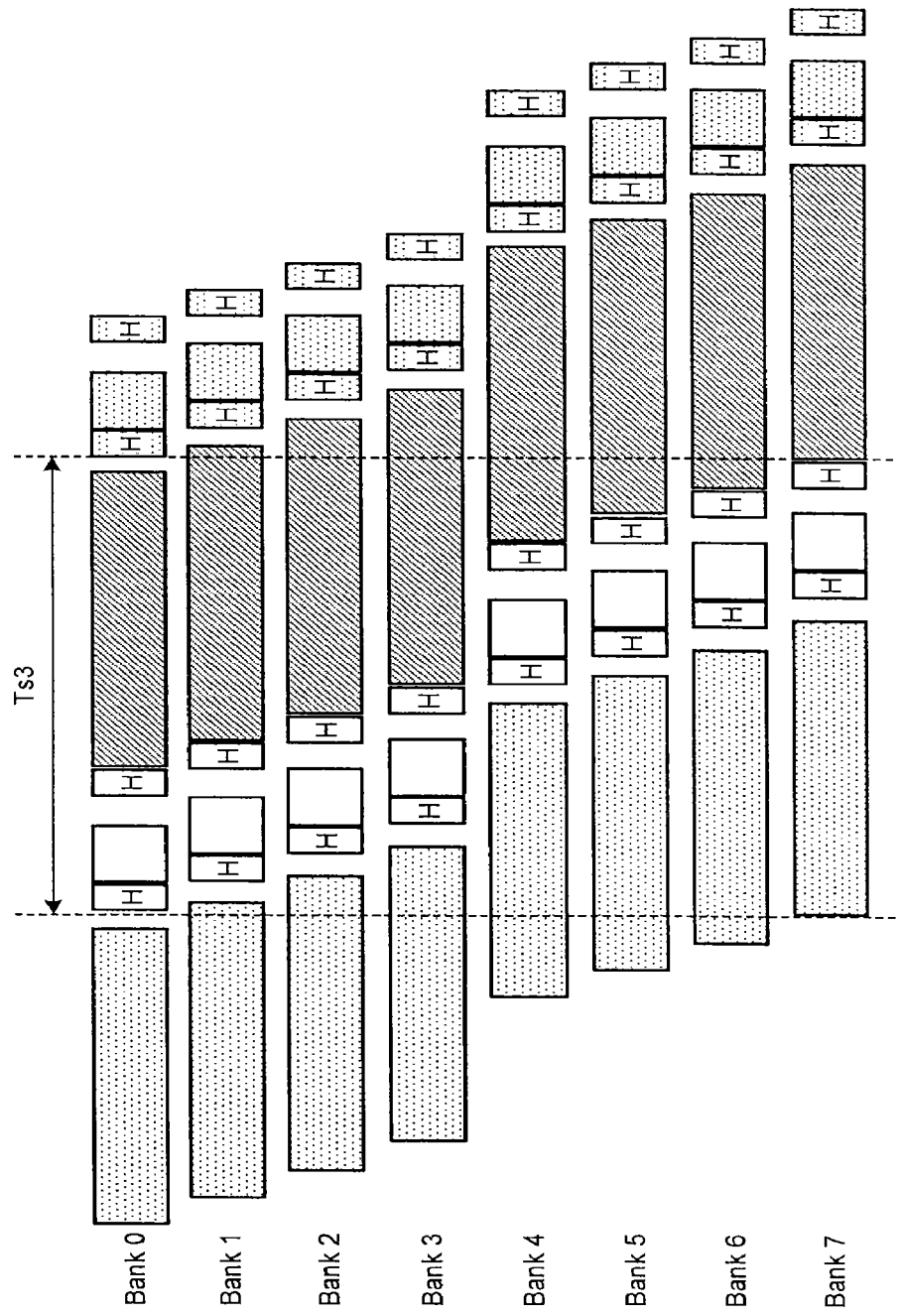
FIG. 30 is a time chart of when a sequential write is performed in the scheduling illustrated in FIG. 29.

FIG. 30 illustrates a time chart of four bank interleaving when the sequential write is performed in the scheduling illustrated in FIG. 27.

In the second embodiment, n banks are divided into a plurality of groups such that three or more banks belong to a group. In the group, data is written in the lower pages of the memory chips belonging to the banks. Data is subsequently written in the upper pages belonging to the banks in the group. In the second embodiment, the usage ratio of each bank increases, which enables the speedup of the write process.

Third Embodiment

Figure 31:
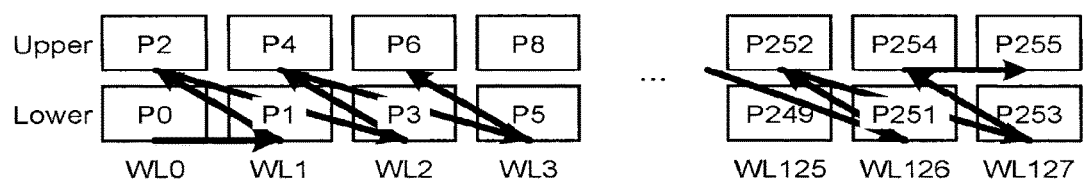
FIG. 31 is a diagram illustrating page layout in a block.

In the first and second embodiments, a description has been given of the scheduling of pages excluding a start page and an end page in one block. In the third embodiment, a description is given of scheduling including a start page and an end page in one block. It is assumed that 256 pages constitute one block. FIG. 31 illustrates a layout example of pages in a block. WL0 to WL127 denote word lines. In order to prevent program disturb due to interference between neighboring cells, page layout is adopted in which a write to an adjacent memory cell does not continuously occur even if writing is performed in the order of page numbers.

Focusing on writes to a block of one bank in the scheduling described above, the lower and upper pages are alternatingly programmed, for example, L→U→L→U→L→U, from P1 to P254. However, if all pages in a block are written as illustrated in FIG. 31, P0 (page 0) being both the start page and the lower page is firstly programmed, and P255 (page 255) being both the end page and the upper page is lastly programmed. Hence, the write operation from P0 to P255 is L→L→U→L→U→L→U→ . . . L→U→U.

Figure 32:
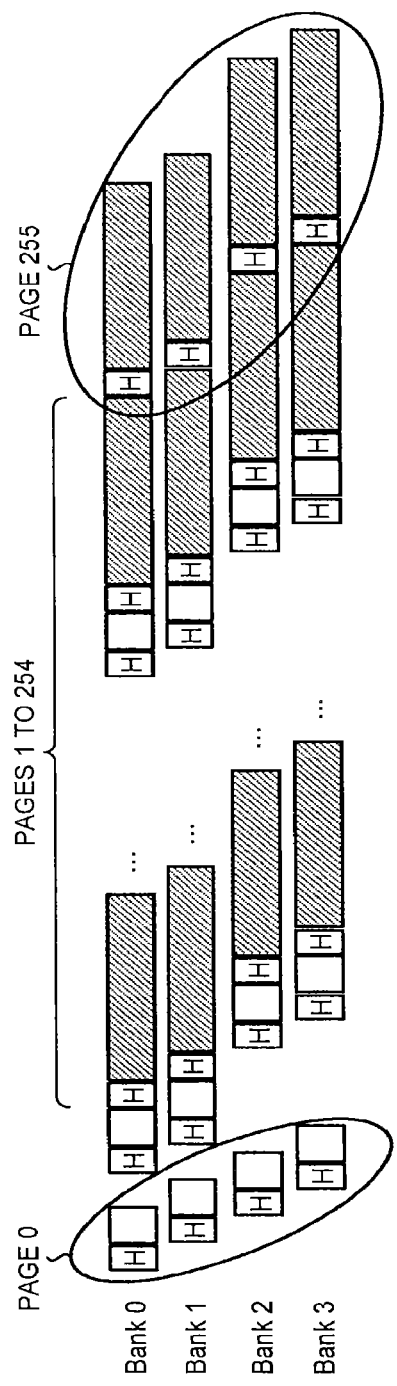
FIG. 32 is a time chart illustrating a state of performing sequential writing on all pages in blocks using the scheduling for four bank interleaving in the first embodiment.

FIG. 32 illustrates a time chart when interleaving writing is performed on all pages in blocks of four banks while the scheduling of the first embodiment is adopted. FIG. 32 illustrates the sequential write.

Firstly, the host writing is performed on page 0 (lower page) of banks 0 to 3. The host writing is then performed on page 1 (upper page) to page 254 (upper page) of banks 0 to 3. Lastly, the host writing is performed on page 255 (upper page) of banks 0 to 3.

In the embodiment, writing from a start page to an end page of the block may be performed by writing to the lower page and the upper page in alternation. In this case, the write operation from P0 to P255 is L→U→L→U→L→U→ . . . L→U→L→U.

In the embodiment, the bank interleaving operation is performed on the same page number among the memory chips of the banks. However, as long as writing is performed in the memory chip in the order of page numbers, bank interleaving may be performed on different page numbers among the memory chips.

Hence, in the embodiment, each of the n banks belong to any of a plurality of groups such that m (m<n) banks at the maximum belong to one group. In the embodiment, the first process is executed such that writing is performed in a memory chip in the order of page numbers. The first process includes executing, in the order of group units, the process of writing data in the lower pages of memory chips belonging to the banks in one group, and subsequently writing data in the upper pages belonging to the banks in the group.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a plurality of non-volatile memory chips including a first memory chip, a second memory chip, and a third memory chip, the first memory chip belonging to a first group, the second memory chip belonging to a second group, the third memory chip belonging to a third group, each memory chip including at least one memory block, each memory block including a plurality of pages of a first type and a plurality of pages of a second type, the second type being different from the first type; and
a controller circuit configured to repeatedly execute a first process, the first process including a second process, a third process, a fourth process, and a fifth process,
the second process being a process in which first data is written to a page of the first type of a memory block of the first memory chip, and then second data is written to a page of the first type of a memory block of the second memory chip,
the third process being a process that is executed after the second process, the third process being a process in which third data is written to a page of the second type of the memory block of the first memory chip, and then fourth data is written to a page of the second type of the memory block of the second memory chip,
the fourth process being a process that is executed after the third process, the fourth process being a process in which fifth data is written to a page of the first type of a memory block of the third memory chip,
the fifth process being a process that is executed after the fourth process, the fifth process being a process in which sixth data is written to a page of the second type of the memory block of the third memory chip.

2. The memory system according to claim 1, wherein the first memory chip, the second memory chip, and the third memory chip each include a plurality of memory blocks and a buffer, the buffer being configured to buffer data that is to be programmed into at least one of the memory blocks, and
while programming the first data buffered in the buffer of the first memory chip into the page of the first type of the memory block of the first memory chip, the controller circuit transfers the second data from the controller circuit to the buffer of the second memory chip.

3. The memory system according to claim 1, wherein
the first memory chip, the second memory chip, and the third memory chip each include a plurality of memory blocks and a buffer, the buffer being configured to buffer data that is to be programmed into at least one of the memory blocks, and
while programming the second data buffered in the buffer of the second memory chip into the page of the first type of the memory block of the second memory chip, the controller circuit transfers the third data from the controller circuit to the buffer of the first memory chip.

4. The memory system according to claim 1, wherein
the first memory chip, the second memory chip, and the third memory chip each include a plurality of memory blocks and a buffer, the buffer being configured to buffer data that is to be programmed into at least one of the memory blocks, and
after starting of programming the fourth data buffered in the buffer of the second memory chip into the page of the second type of the memory block of the second memory chip,
the controller circuit transfers the fifth data from the controller circuit to the buffer of the third memory chip, and programs the transferred fifth data into the page of the first type of the memory block of the third memory chip through the buffer of the third memory chip.

5. The memory system according to claim 1, wherein
the first memory chip, the second memory chip, and the third memory chip each include a plurality of memory blocks and a buffer, the buffer being configured to buffer data that is to be programmed into at least one of the memory blocks, and
after starting of programming the fourth data buffered in the buffer of the second memory chip into the page of the second type of the memory block of the second memory chip,
the controller circuit executes at least a part of a first data processing, the first data processing including reading out a seventh data from another memory block of the third memory chip or a memory block of a fourth memory chip that is different from the third memory chip, transferring the read-out seventh data as the fifth data from the controller circuit to the buffer of the third memory chip, and programming the transferred seventh data into the page of the first type of the memory block of the third memory chip as the fifth data.

6. The memory system according to claim 1, wherein
the controller circuit writes data in an order of page numbers from a start page to an end page in a memory block, the start page being a page of the first type, the end page being a page of the second type, pages between the start page and the end page in the memory block being written in an order of a page of the first type and a page of the second type in alternation.

7. The memory system according to claim 1, wherein
a time period for programming data into a page of the first type is shorter than a time period for programming data into a page of the second type.

8. A memory controller configured to control a plurality of non-volatile memory chips, the non-volatile memory chips including a first memory chip, a second memory chip, and a third memory chip, the first memory chip belonging to a first group, the second memory chip belonging to a second group, the third memory chip belonging to a third group, each memory chip including at least one memory block, each memory block including a plurality of pages of a first type and a plurality of pages of a second type, the second type being different from the first type; the memory controller comprising:
an interface circuit configured to be used for transferring or receiving data to or from the non-volatile memory chips; and a controller circuit configured to repeatedly execute a first process, the first process including a second process, a third process, a fourth process, and a fifth process,
the second process being a process in which first data is written to a page of the first type of a memory block of the first memory chip, and then second data is written to a page of the first type of a memory block of the second memory chip,
the third process being a process that is executed after the second process, the third process being a process in which third data is written to a page of the second type of the memory block of the first memory chip, and then fourth data is written to a page of the second type of the memory block of the second memory chip,
the fourth process being a process that is executed after the third process, the fourth process being a process in which fifth data is written to a page of the first type of a memory block of the third memory chip,
the fifth process being a process that is executed after the fourth process, the fifth process being a process in which sixth data is written to a page of the second type of the memory block of the third memory chip.

9. The memory controller according to claim 8, wherein
the first memory chip, the second memory chip, and the third memory chip each include a plurality of memory blocks and a buffer, the buffer being configured to buffer data that is to be programmed into at least one of the memory blocks, and
while programming the first data buffered in the buffer of the first memory chip into the page of the first type of the memory block of the first memory chip, the controller circuit transfers the second data from the controller circuit to the buffer of the second memory chip.

10. The memory controller according to claim 8, wherein
the first memory chip, the second memory chip, and the third memory chip each include a plurality of memory blocks and a buffer, the buffer being configured to buffer data that is to be programmed into at least one of the memory blocks, and
while programming the second data buffered in the buffer of the second memory chip into the page of the first type of the memory block of the second memory chip, the controller circuit transfers the third data from the controller circuit to the buffer of the first memory chip.

11. The memory controller according to claim 8, wherein
the first memory chip, the second memory chip, and the third memory chip each include a plurality of memory blocks and a buffer, the buffer being configured to buffer data that is to be programmed into at least one of the memory blocks, and
after starting of programming the fourth data buffered in the buffer of the second memory chip into the page of the second type of the memory block of the second memory chip,
the controller circuit transfers the fifth data from the controller circuit to the buffer of the third memory chip, and programs the transferred fifth data into the page of the first type of the memory block of the third memory chip through the buffer of the third memory chip.

12. The memory controller according to claim 8, wherein
the first memory chip, the second memory chip, and the third memory chip each include a plurality of memory blocks and a buffer, the buffer being configured to buffer data that is to be programmed into at least one of the memory blocks, and after starting of programming the fourth data buffered in the buffer of the second memory chip into the page of the second type of the memory block of the second memory chip, the controller circuit executes at least a part of a first data processing, the first data processing including reading out a seventh data from another memory block of the third memory chip or a memory block of a fourth memory chip that is different from the third memory chip, transferring the read-out seventh data as the fifth data from the controller circuit to the buffer of the third memory chip, and programming the transferred seventh data into the page of the first type of the memory block of the third memory chip as the fifth data.

13. The memory controller according to claim 8, wherein a time period for programming data into a page of the first type is shorter than a time period for programming data into a page of the second type.

14. A control method of controlling a plurality of non-volatile memory chips and a controller circuit, the non-volatile memory chips including a first memory chip, a second memory chip, and a third memory chip, the first memory chip belonging to a first group, the second memory chip belonging to a second group, the third memory chip belonging to a third group, each memory chip including at least one memory block, each memory block including a plurality of pages of a first type and a plurality of pages of a second type, the second type being different from the first type; the control method comprising:

repeatedly executing a first process, the first process including a second process, a third process, a fourth process, and a fifth process, the second process being a process in which first data is written to a page of the first type of a memory block of the first memory chip, and then second data is written to a page of the first type of a memory block of the second memory chip, the third process being a process that is executed after the second process, the third process being a process in which third data is written to a page of the second type of the memory block of the first memory chip, and then fourth data is written to a page of the second type of the memory block of the second memory chip, the fourth process being a process that is executed after the third process, the fourth process being a process in which fifth data is written to a page of the first type of a memory block of the third memory chip, the fifth process being a process that is executed after the fourth process, the fifth process being a process in which sixth data is written to a page of the second type of the memory block of the third memory chip.

15. The control method according to claim 14, wherein the first memory chip, the second memory chip, and the third memory chip each include a plurality of memory blocks and a buffer, the buffer being configured to buffer data that is to be programmed into at least one of the memory blocks, the method further comprising:

while programming the first data buffered in the buffer of the first memory chip into the page of the first type of the memory block of the first memory chip, transferring the second data from the controller circuit to the buffer of the second memory chip.

16. The control method according to claim 14, wherein the first memory chip, the second memory chip, and the third memory chip each include a plurality of memory blocks and a buffer, the buffer being configured to buffer data that is to be programmed into at least one of the memory blocks, the method further comprising:

while programming the second data buffered in the buffer of the second memory chip into the page of the first type of the memory block of the second memory chip, transferring the third data from the controller circuit to the buffer of the first memory chip.

17. The control method according to claim 14, wherein the first memory chip, the second memory chip, and the third memory chip each include a plurality of memory blocks and a buffer, the buffer being configured to buffer data that is to be programmed into at least one of the memory blocks, the method further comprising:

after starting of programming the fourth data buffered in the buffer of the second memory chip into the page of the second type of the memory block of the second memory chip, transferring the fifth data from the controller circuit to the buffer of the third memory chip, and programming the transferred fifth data into the page of the first type of the memory block of the third memory chip through the buffer of the third memory chip.

18. The control method according to claim 14, wherein the first memory chip, the second memory chip, and the third memory chip each include a plurality of memory blocks and a buffer, the buffer being configured to buffer data that is to be programmed into at least one of the memory blocks, the method further comprising:

after starting of programming the fourth data buffered in the buffer of the second memory chip into the page of the second type of the memory block of the second memory chip, executing at least a part of a first data processing, the first data processing including reading out a seventh data from another memory block of the third memory chip or a memory block of a fourth memory chip that is different from the third memory chip, transferring the read-out seventh data as the fifth data from the controller circuit to the buffer of the third memory chip, and programming the transferred seventh data into the page of the first type of the memory block of the third memory chip as the fifth data.

19. The control method according to claim 14, the method further comprising writing data in an order of page numbers from a start page to an end page in a memory block, the start page being a page of the first type, the end page being a page of the second type, pages between the start page and the end page in the memory block being written in an order of a page of the first type and a page of the second type in alternation.

20. The control method according to claim 14, wherein a time period for programming data into a page of the first type is shorter than a time period for programming data into a page of the second type.

21. The memory system according to claim 1, wherein, in the second process, the first data is written to the page of the first type of a first word line of the memory block of the first memory chip, the second data is written to the page of the first type of a first word line of the memory block of the second memory chip, in the third process, the third data is written to the page of the second type of a second word line of the memory block of the first memory chip, the fourth data is written to the page of the second type of a second word line of the memory block of the second memory chip, in the fourth process, the fifth data is written to the page of the first type of a first word line of the memory block of the third memory chip, and in the fifth process, the sixth data is written to the page of the second type of a second word line of the memory block of the third memory chip.

22. The memory controller according to claim 8, wherein, in the second process, the first data is written to the page of the first type of a first word line of the memory block of the first memory chip, the second data is written to the page of the first type of a first word line of the memory block of the second memory chip, in the third process, the third data is written to the page of the second type of a second word line of the memory block of the first memory chip, the fourth data is written to the page of the second type of a second word line of the memory block of the second memory chip, in the fourth process, the fifth data is written to the page of the first type of a first word line of the memory block of the third memory chip, and in the fifth process, the sixth data is written to the page of the second type of a second word line of the memory block of the third memory chip.

23. The control method according to claim 14, wherein, in the second process, the first data is written to the page of the first type of a first word line of the memory block of the first memory chip, the second data is written to the page of the first type of a first word line of the memory block of the second memory chip, in the third process, the third data is written to the page of the second type of a second word line of the memory block of the first memory chip, the fourth data is written to the page of the second type of a second word line of the memory block of the second memory chip, in the fourth process, the fifth data is written to the page of the first type of a first word line of the memory block of the third memory chip, and in the fifth process, the sixth data is written to the page of the second type of a second word line of the memory block of the third memory chip.

* * * * *